(12) United States Patent
Jung et al.

(10) Patent No.: US 10,581,256 B2
(45) Date of Patent: Mar. 3, 2020

(54) CONTROL METHOD AND ELECTRONIC DEVICE BASED ON BATTERY LEAKAGE STATE

(71) Applicant: SAMSUNG ELECTRONICS CO., LTD., Suwon-si, Gyeonggi-do (KR)

(72) Inventors: Ku-Chul Jung, Suwon-si (KR);
Chul-Woo Park, Hwaseong-si (KR);
Sang-Hyun Ryu, Suwon-si (KR);
Min-Jung Park, Suwon-si (KR);
Jeong-Ho Lee, Gwangmyeong-si (KR);
Chi-Hyun Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 49 days.

(21) Appl. No.: 15/916,653

(22) Filed: Mar. 9, 2018

(65) Prior Publication Data
US 2018/0262027 A1    Sep. 13, 2018

(30) Foreign Application Priority Data
Mar. 10, 2017   (KR) .................. 10-2017-0030709

(51) Int. Cl.
*H02J 7/00*    (2006.01)
*G01R 31/02*    (2006.01)
(Continued)

(52) U.S. Cl.
CPC .......... *H02J 7/0031* (2013.01); *G01R 31/025* (2013.01); *G01R 31/026* (2013.01); *G01R 31/389* (2019.01); *H01M 10/0525* (2013.01)

(58) Field of Classification Search
CPC ... A63B 23/16; A63B 21/4023; A63B 21/455; A63B 21/28
See application file for complete search history.

(56) References Cited

U.S. PATENT DOCUMENTS 6,177,780 B1    1/2001 Roy et al.
2011/0298626 A1* 12/2011 Fechalos ............. H01M 10/482
340/664

(Continued)

FOREIGN PATENT DOCUMENTS

| JP | 07-123599 | 5/1995 |
| JP | 2013-134120 | 7/2013 |
| KR | 10-2012-0058799 | 6/2012 |

OTHER PUBLICATIONS

Search Report dated Jun. 20, 2018 in counterpart International Patent Application No. PCT/KR2018/002828.

(Continued)

*Primary Examiner* — Dominic E Hawkins
(74) *Attorney, Agent, or Firm* — Nixon & Vanderhye P.C.

(57) ABSTRACT

Various embodiments relating to an electronic device and a method based on a battery leakage state have been described. According to an example embodiment, an electronic device includes a display; a communication circuit; a battery; a current sensor configured to measure a charge current used for charging the battery; and a processor, wherein the processor may be configured to measure a charge current using the current sensor, to determine a leakage state of the battery based on at least a part of the charge current, and to provide a notification corresponding to the leakage state through the display and/or perform a specified function corresponding to the leakage state based on at least a part of the leakage state.

20 Claims, 17 Drawing Sheets

(51) Int. Cl.
*H01M 10/0525* (2010.01)
*G01R 31/389* (2019.01)

(56) References Cited

U.S. PATENT DOCUMENTS

| | | |
|---|---|---|
| 2012/0229098 A1 | 9/2012 | Krauer et al. |
| 2014/0217984 A1 | 8/2014 | Banerjee et al. |
| 2014/0225574 A1* | 8/2014 | Boda .................. H02J 7/0014 |
| | | 320/162 |
| 2014/0376137 A1* | 12/2014 | Wang .................. G01R 31/025 |
| | | 361/86 |
| 2015/0022153 A1 | 1/2015 | Bouchez et al. |

OTHER PUBLICATIONS

Written Opinion dated Jun. 20, 2018 in counterpart International Patent Application No. PCT/KR2018/002828.

\* cited by examiner

| LEAKAGE LEVEL | |
|---|---|
| A | TIME DURING WHICH CHARGING IS PERFORMED IN STATE WHERE CHARGE CURRENT HAS VALUE FROM MAXIMUM CHARGEABLE CURRENT TO FIRST CHARGE CURRENT EXCEEDS FIRST TIME PERIOD |
| B | TIME DURING WHICH CHARGING IS PERFORMED IN STATE WHERE CHARGE CURRENT HAS VALUE FROM FIRST CHARGE CURRENT TO SECOND CHARGE CURRENT EXCEEDS SECOND TIME PERIOD |
| C | TIME DURING WHICH CHARGING IS PERFORMED IN STATE WHERE CHARGE CURRENT HAS VALUE FROM SECOND CHARGE CURRENT TO THIRD CHARGE CURRENT EXCEEDS THIRD TIME PERIOD |
| D/E/F/G | STATE WHERE CHARGE CURRENT IS EQUAL TO OR LESS THAN THIRD CHARGE CURRENT AND NUMBER OF TIMES OF AUXILIARY CHARGE IS EQUAL TO OR LARGER THAN PREDETERMINED NUMBER OF TIMES |

FIG.10

DEVICE A

| NUMBER OF TIMES OF CHARGING | ... | 101 | 102 | 103 | 104 | 105 | 106 | ... |
|---|---|---|---|---|---|---|---|---|
| LEAKAGE LEVEL | – | G | G | G | G | G | G | – |
| TEMPERATURE | – | 50 | 51 | 50 | 49 | 50 | 50 | – |
| WIRED/WIRELESS | – | WIRED | WIRED | WIRED | WIRED | WIRED | WIRED | – |

FIG.11A

DEVICE B

| NUMBER OF TIMES OF CHARGING | ... | 301 | 302 | 303 | 304 | 305 | 306 | ... |
|---|---|---|---|---|---|---|---|---|
| LEAKAGE LEVEL | – | G | G | F | F | C | B | – |
| TEMPERATURE | – | 50 | 51 | 50 | 52 | 53 | 55 | – |
| WIRED/WIRELESS | – | WIRED | WIRED | WIRED | WIRED | WIRED | WIRED | – |

FIG.11B

DEVICE C

| NUMBER OF TIMES OF CHARGING | ... | 501 | 502 | 503 | 504 | 505 | 506 | ... |
|---|---|---|---|---|---|---|---|---|
| LEAKAGE LEVEL | – | G | G | F | C | A | A | – |
| TEMPERATURE | – | 50 | 51 | 52 | 53 | 56 | 58 | – |
| WIRED/WIRELESS | – | WIRED | WIRED | WIRED | WIRED | WIRED | WIRED | – |

FIG.11C

CONTROL METHOD AND ELECTRONIC DEVICE BASED ON BATTERY LEAKAGE STATE

CROSS-REFERENCE TO RELATED APPLICATION

This application is based on and claims priority under 35 U.S.C. § 119 to Korean Application Serial No. 10-2017-0030709, which was filed in the Korean Intellectual Property Office on Mar. 10, 2017, the content of which is incorporated by reference herein in its entirety.

TECHNICAL FIELD

The present disclosure relates generally to a battery of an electronic device.

BACKGROUND

Recent and remarkable developments in information technology and semiconductor technology have rapidly increased in the supply and use of various electronic devices. In particular, recent electronic devices are portable and capable of performing communication, and allow the use of rechargeable batteries in many cases. A battery affects the performance and the usage time of a portable electronic device. Further, as the usage of a portable electronic device increases, interest in batteries is continually increasing. The battery used for a portable electronic device has been manufactured in various shapes using various materials and is thus implemented in various types.

The battery of an electronic device may be referred to as a battery cell and may include a compound of various materials. The battery may be charged according to the supply of proper charge current during proper times and may be discharged by providing the power charged therein to the electronic device. While a battery is charged, when a charge current higher than the proper charge current is supplied to the battery, or when the proper charge current is supplied during a predetermined amount of times or more, high charge current or overcharge causes an increase in the internal temperature of the battery or decomposition of an electrode, thereby damaging the battery.

An electronic device may supply proper charge current to a battery during proper times. However, the situation where a charge current greater than the charge current is needed or where a charging time takes longer than a specified time may occur. As described above, when a charge current greater than a pre-specified charge current is supplied to the battery or when a charging time takes longer than a pre-specified time, overcharge current causes an increase in the internal temperature of the battery or decomposition of an electrode, thereby damaging the battery.

SUMMARY

Various example embodiments of the present disclosure may provide an electronic device and a control method based on a battery leakage state, which can detect a leakage current of a battery in electronic device.

In addition, various example embodiments of the present disclosure may provide an electronic device and a control method based on a battery leakage state, which can detect a leakage state of a battery based on a charging profile in order to supply a proper charge current to the battery during a proper time in the electronic device and can control various functions of the electronic device based on a leakage state.

In addition, various example embodiments of the present disclosure may provide an electronic device and a control method based on a battery leakage state, wherein a charging profile is predetermined, configured or changed based on a status of the electronic device, or remotely transmitted, and a charging profile which is changed based on a battery leakage state or remotely transmitted can be used.

In addition, various example embodiments of the present disclosure may provide an electronic device and a control method based on a battery leakage state, which can warn of a leakage state of a battery based on a battery leakage state and electronic device status information or can control a function based on a battery leakage state.

According to various example embodiments, an electronic device may include: a display; a communication circuit; a battery; a current sensor configured to measure a charge current used for charging the battery; and a processor, wherein the processor may be configured to measure a charge current using the current sensor, to determine a leakage state of the battery based on at least a part of the charge current, and to provide a notification corresponding to the leakage state through the display and/or perform a specified function corresponding to the leakage state based on at least a part of the leakage state.

According to various example embodiments, a control method based on a battery leakage state in an electronic device may include: identifying a charge current used for charging a battery; determining a leakage state of the battery based on at least a part of the charge current; and performing a specified function corresponding to the leakage state based on at least a part of the leakage state.

According to various example embodiments, an electronic device may include: a display; a communication circuit; a battery; a current sensor; and a processor, wherein the processor may be configured to: measure a charge current used for charging the battery using the current sensor; determine a current leakage state of the battery based on at least a part of the charge current or status information on the electronic device; provide a notification corresponding to the first state through the display when the current leakage state is a first state; and limit at least one function relating to the charging of the battery when the current leakage state is a second state.

According to various example embodiments, in a non-transitory computer-readable storage medium that stores a control program based on a battery leakage state, the program may, when executed by a processor, cause an electronic device to measure a charge current, determine a leakage state of the battery based on at least a part of the charge current, and provide a notification corresponding to the leakage state through the display and/or perform a specified function corresponding to the leakage state based on at least a part of the leakage state.

According to various example embodiments of the present disclosure, a leakage current of a battery itself can be detected in an electronic device, so that the increase in a battery internal temperature increase and electrode decomposition which occur due to a battery leakage current can be prevented and/or reduced and various malfunctions of the electronic device which occur due to a battery leakage current can be prevented and/or reduced.

In addition, according to various example embodiments of the present disclosure, a battery leakage current for each predetermined section is detected based on a charging profile, so that a battery leakage state can be detected more frequently, whereby the occurrence of battery leakage can be noticed quickly and minute leakage which might otherwise be missed can be detected.

In addition, according to various example embodiments of the present disclosure, a warning pertaining to a battery leakage state can be made and/or a function based on a battery leakage state can be controlled based on a leakage state and electronic device status information, so that an accident, such as explosion of a battery, resulting from battery current leakage can be prevented and/or reduced.

According to various example embodiments of the present disclosure, the state of an electronic device can be identified through a server by transmitting a leakage state and electronic device status information to the server, and when a danger status is determined, a function relating to charging of the electronic device can be remotely controlled or a charging profile can be changed.

BRIEF DESCRIPTION OF THE DRAWINGS

The above and/or other aspects, features, and attendant advantages of the present disclosure will be more apparent and readily appreciated from the following detailed description, taken in conjunction with the accompanying drawings, in which like reference numerals refer to like elements, and wherein:

FIG. 10 is a table illustrating an example leakage levels according to each time period according to various example embodiments;

FIGS. 11A, 11B and 11C are diagrams illustrating an example of a leakage level storage table according to various example embodiments;

DETAILED DESCRIPTION

Figure 1:
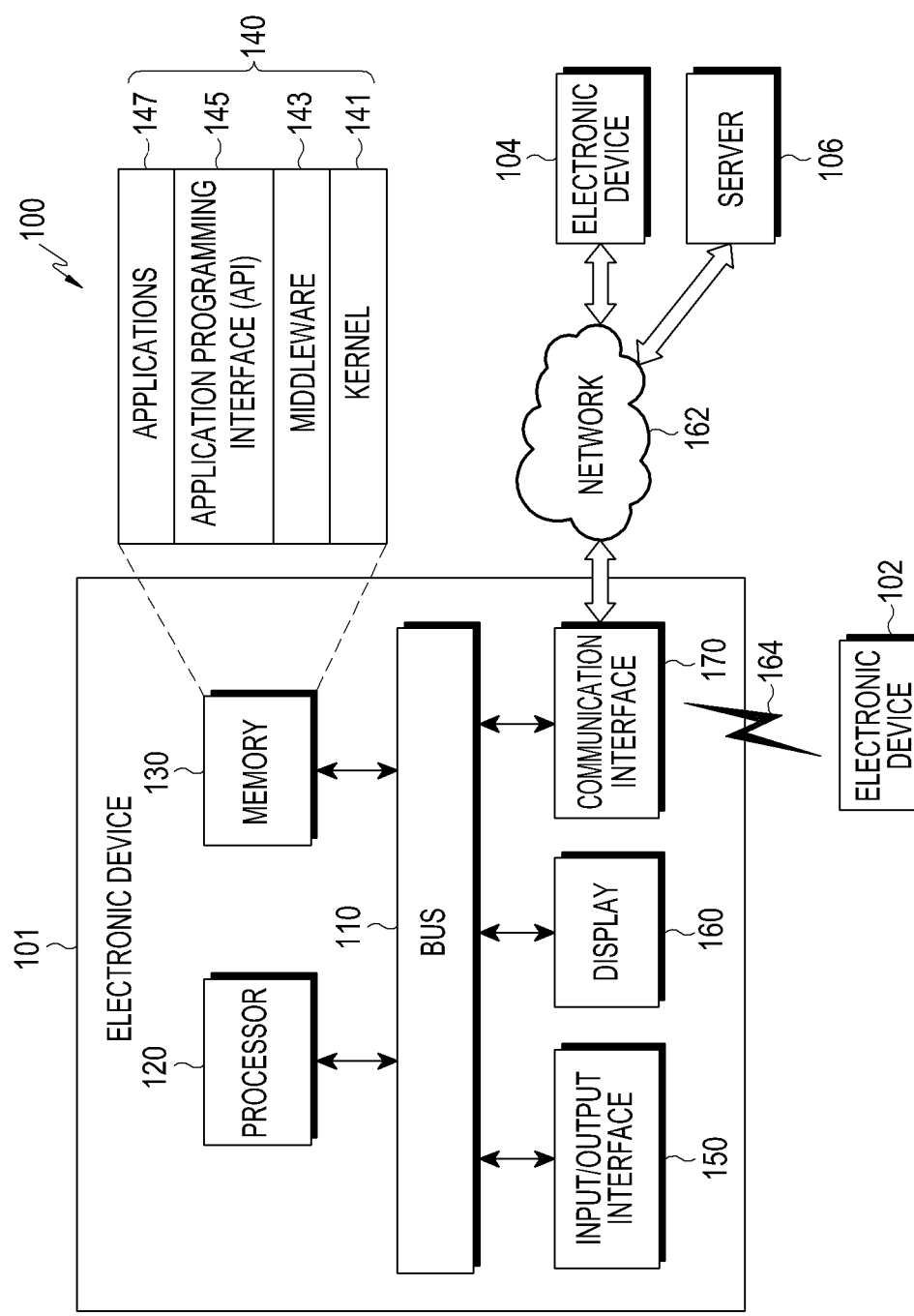
FIG. 1 is a block diagram illustrating a network environment including an electronic device according to various example embodiments.

Hereinafter, various example embodiments of the present disclosure will be described with reference to the accompanying drawings. The example embodiments and the terms used therein are not intended to limit the technology disclosed herein to specific forms, and should be understood to include various modifications, equivalents, and/or alternatives to the various example embodiments. In describing the drawings, similar reference numerals may be used to designate similar elements. A singular expression may include a plural expression unless they are definitely different in context. In the present disclosure, the expression "A or B", "at least one of A or/and B", or the like may include all possible combinations of the items listed. The expression "a first", "a second", "the first", or "the second" may modify the corresponding elements regardless of the order and/or the importance thereof, and may be used to distinguish an element from another element, but does not limit the corresponding elements. When an element (e.g., a first element) is referred to as being "(functionally or communicatively) coupled," or "connected" to another element (e.g., a second element), the element may be connected directly to the another element, or may be connected to the another element through yet another element (e.g., a third element).

The expression "configured to" in the present disclosure may be interchangeably used with, for example, "suitable for", "having the capacity to", "adapted to", "made to", "capable of", or "designed to" in terms of hardware or software, depending on circumstances. Alternatively, in some situations, the expression "device configured to" may refer to a situation in which the device, together with other devices or components, "is able to". For example, the phrase "processor adapted (or configured) to perform A, B, and C" may refer to, for example, and without limitation, a dedicated processor (e.g. an embedded processor) for performing the corresponding operations or a general-purpose processor (e.g., a Central Processing Unit (CPU) or Application Processor (AP)), or the like, that can perform the corresponding operations by executing one or more software programs stored in a memory device.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a mobile medical device, a camera, and a wearable device, or the like, but is not limited thereto. According to various embodiments, the wearable device may include at least one of an accessory type (e.g., a watch, a ring, a bracelet, an anklet, a necklace, a pair of glasses, a contact lens, or a Head-Mounted Device (HMD)), a fabric- or clothing-integrated type (e.g., a piece of electronic clothing), a body-mounted type (e.g., a skin pad, or tattoo), and a bio-implantable type (e.g., an implantable circuit), or the like, but is not limited thereto. In some embodiments, the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, and an electronic photo frame, or the like, but is not limited thereto.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA) device, a Magnetic Resonance Imaging (MRI) device, a Computed Tomography (CT) machine, a tomograph and an ultrasonic machine), a navigation device, a global navigation satellite system (GNSS), an Event Data Recorder (EDR), a Flight Data Recorder (FDR), a Vehicle Infotainment Devices, an electronic devices for a ship (e.g., a navigation device for a ship, and a gyro-compass), avionics device, security devices, an automotive head unit, a robot for home or industry, a drone, an automated teller machine (ATM) in a bank, a point of sales (POS) terminal in a shop, or an internet of things device (e.g., a light bulb, various sensors, a sprinkler device, a fire alarm, a thermostat, a streetlamp, a toaster, a sporting goods item, a hot water tank, a heater, a boiler, etc.), or the like, but is not limited thereto. According to some embodiments, an electronic device may include at least one of a part of furniture, a building/structure, or a vehicle, an electronic board, an electronic signature receiving device, a projector, and various types of measuring instruments (e.g., a water meter, an electric meter, a gas meter, a radio wave meter, and the like), or the like, but is not limited thereto. In various embodiments, the electronic device may be flexible, or may be a combination of two or more of the aforementioned various devices. The electronic device according to an example embodiment of the present disclosure is not limited to the above described devices. In the present disclosure, the term "user" may indicate a person using an electronic device or a device (e.g., an artificial intelligence electronic device) using an electronic device.

Referring to FIG. 1, an electronic device 101 within a network environment 100 according to various example embodiments will be described. The electronic device 101 may include a bus 110, a processor 120, a memory 130, an input/output interface 150, a display 160, and a communication interface 170. In some embodiments, the electronic device 101 may omit at least one of the elements, or may further include other elements.

The bus 110 may include a circuit that interconnects the elements 110 to 170 and transmits communication (for example, control messages or data) between the elements.

The processor 120 may include various processing circuitry, such as, for example, and without limitation, one or more of a dedicated processor, a central processing unit, an application processor, and a communication processor (CP), or the like. The processor 120, for example, may carry out operations or data processing relating to the control and/or communication of at least one other element of the electronic device 101.

The memory 130 may include a volatile and/or non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an operating system. The kernel 141 may, for example, control or manage system resources (for example, the bus 110, the processor 120, or the memory 130) used for executing an operation or function implemented by other programs (for example, the middleware 143, the API 145, or the application 147). Furthermore, the kernel 141 may provide an interface through which the middleware 143, the API 145, or the application programs 147 may access the individual elements of the electronic device 101 to control or manage the system resources.

The middleware 143 may function as, for example, an intermediary for allowing the API 145 or the application programs 147 to communicate with the kernel 141 to exchange data. Furthermore, the middleware 143 may process one or more task requests, which are received from the application programs 147, according to priorities thereof. For example, the middleware 143 may assign priorities for using the system resources (for example, the bus 110, the processor 120, the memory 130, or the like) of the electronic device 101 to one or more of the application programs 147, and may process the one or more task requests. The API 145 is an interface through which the applications 147 control functions provided from the kernel 141 or the middleware 143, and may include, for example, at least one interface or function (for example, instruction) for file control, window control, image processing, or text control.

For example, the input/output interface 150 may include various input/output circuitry that forward instructions or data, input from a user or an another external device, to the other element(s) of the electronic device 101, or may output instructions or data, received from the other element(s) of the electronic device 101, to the user or the another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display, or the like, but is not limited thereto. The display 160 may display, for example, various types of content (e.g., text, images, videos, icons, and/or symbols) for a user. The display 160 may include a touch screen and may receive, for example, a touch, gesture, proximity, or hovering input using an electronic pen or the user's body part.

The communication interface 170, for example, may set communication between the electronic device 101 and an external device (e.g., a first external electronic device 102, a second external electronic device 104, or a server 106). For example, the communication interface 170 may be connected to a network 162 through wireless or wired communication to communicate with the external device (for example, the second external electronic device 104 or the server 106).

The wireless communication may include, for example, cellular communication that uses at least one of LTE, LTE-Advanced (LTE-A), code division multiple access (CDMA), wideband CDMA (WCDMA), universal mobile telecommunications system (UMTS), wireless broadband (WiBro), global system for mobile communications (GSM), or the like. According to an embodiment, the wireless communication may include, for example, as illustrated as an element 164 in FIG. 1, at least one of Wireless Fidelity (WiFi), Lite Fidelity (LiFi), Bluetooth, Bluetooth Low Energy (BLE), Zigbee, Near Field Communication (NFC), magnetic secure transmission, Radio Frequency (RF), and Body Area Network (BAN). According to an embodiment, the wireless communication may include GNSS. The GNSS may be, for example, a global positioning system (GPS), a global navigation satellite system (Glonass), a Beidou navigation satellite system (hereinafter, referred to as "Beidou"), or Galileo (the European global satellite-based navigation system). Hereinafter, in this document, the term "GPS" may be interchangeable with the term "GNSS". The wired communication may include, for example, at least one of a Universal Serial Bus (USB), a High Definition Multimedia Interface (HDMI), Recommended Standard 232 (RS-232), a power line communication, a Plain Old Telephone Service (POTS), and the like. The network 162 may include a telecommunications network, for example, at least one of a computer network (for example, a LAN or a WAN), the Internet, and a telephone network.

Each of the first and second external electronic devices 102 and 104 may be of the same or a different type from the electronic device 101. According to various embodiments, all or some of the operations executed in the electronic device 101 may be executed in another electronic device or a plurality of electronic devices (for example, the electronic devices 102 and 104 or the server 106). According to an embodiment, when the electronic device 101 has to perform some functions or services automatically or in response to a request, the electronic device 101 may make a request for performing at least some functions relating thereto to another device (for example, the electronic device 102 or 104 or the server 106) instead of performing the functions or services by itself or in a manner of adding thereto. Another electronic device (for example, the electronic device 102 or 104 or the server 106) may execute the requested functions or the additional functions, and may deliver the result of the execution to the electronic device 101. The electronic device 101 may provide the received result as it is, or may additionally process the received result to provide the requested functions or services. To this end, for example, cloud computing, distributed computing, or client-server computing technology may be used.

Figure 2:
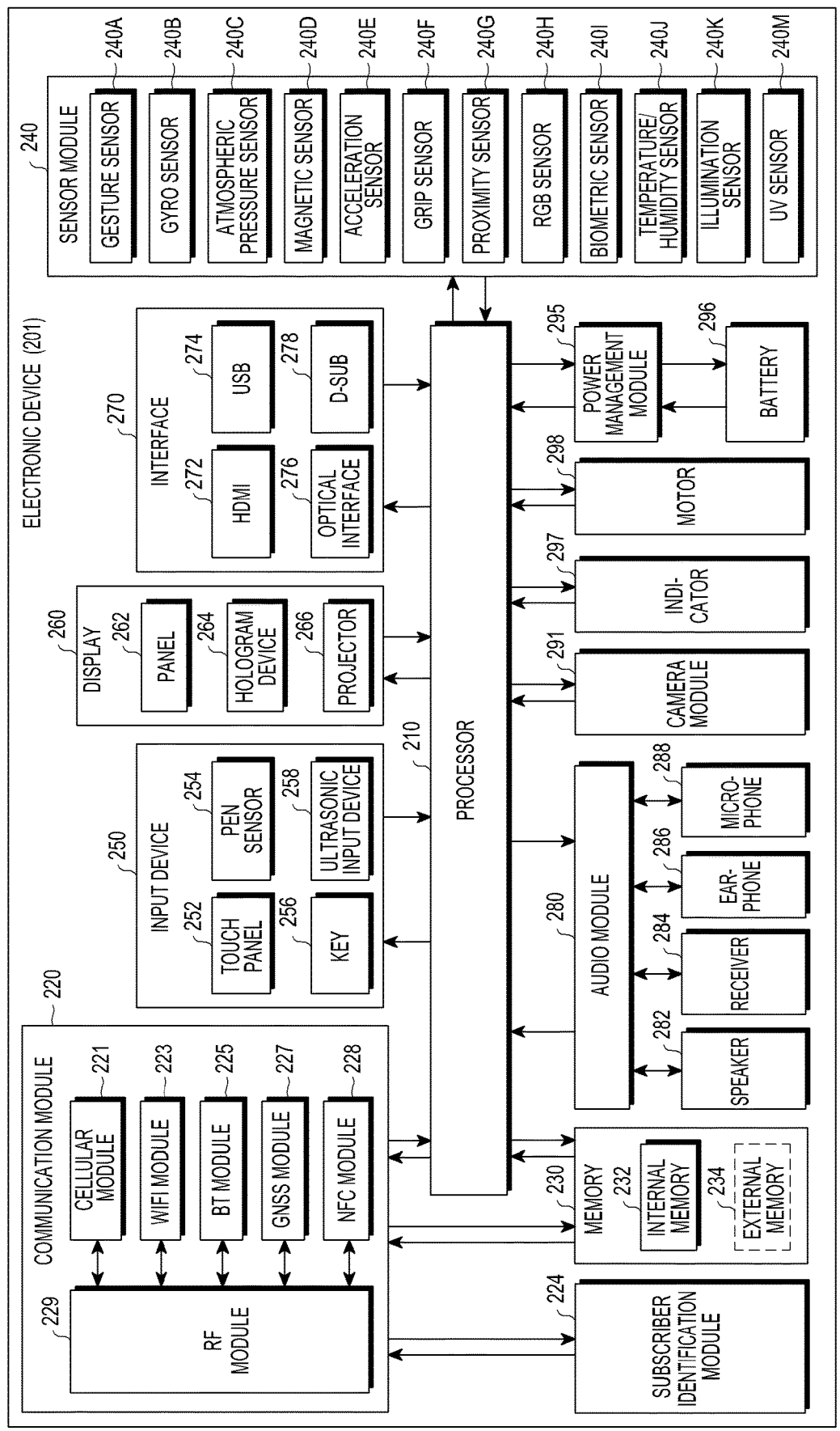
FIG. 2 is a block diagram illustrating an example electronic device according to various example embodiments.

FIG. 2 is a block diagram illustrating an example electronic device according to various example embodiments.

The electronic device 201 may include, for example, the whole or part of the electronic device 101 illustrated in FIG. 1. The electronic device 201 may include at least one processor 210 (for example, an AP), a communication module 220, a subscriber identification module 224, a memory 230, a sensor module 240, an input device 250, a display 260, an interface 270, an audio module 280, a camera module 291, a power management module 295, a battery 296, an indicator 297, and a motor 298.

The processor 210 may, for example, include various processing circuitry and control a plurality of hardware or software elements connected thereto and may perform various data processing and operations by driving an operating system or an application program. The processor 210 may be implemented by, for example, a System on Chip (SoC). According to an embodiment, the processor 210 may further include a graphic processing unit (GPU) and/or an image signal processor. The processor 210 may also include at least some of the elements illustrated in FIG. 2 (for example, a cellular module 221). The processor 210 may load, in volatile memory, instructions or data received from at least one of the other elements (for example, non-volatile memory), process the loaded instructions or data, and store the resultant data in the non-volatile memory.

The communication module 220 may have a configuration that is the same as, or similar to, that of the communication interface 170. The communication module 220 may include various communication circuitry, such as, for example, and without limitation, a cellular module 221, a Wi-Fi module 223, a Bluetooth module 225, a GNSS module 227, an NFC module 228, and an RF module 229, or the like. The cellular module 221 may provide, for example, a voice call, a video call, a text message service, an Internet service, or the like through a communication network. According to an embodiment, the cellular module 221 may identify and authenticate the electronic device 201 within a communication network using the subscriber identification module 224 (for example, a SIM card). According to an embodiment, the cellular module 221 may perform at least some of the functions that the processor 210 may provide. According to an embodiment, the cellular module 221 may include a communication processor (CP). According to some embodiments, at least some (for example, two or more) of the cellular module 221, the Wi-Fi module 223, the BT module 225, the GNSS module 227, and the NFC module 228 may be included in one Integrated Chip (IC) or IC package. The RF module 229 may transmit/receive, for example, a communication signal (for example, an RF signal). The RF module 229 may include, for example, a transceiver, a power amp module (PAM), a frequency filter, a low noise amplifier (LNA), an antenna, or the like. According to another embodiment, at least one of the cellular module 221, the Wi-Fi module 223, the BT module 225, the GNSS module 227, and the NFC module 228 may transmit/receive an RF signal through a separate RF module.

The subscriber identification module 224 may include, for example, a card that includes a subscriber identity module and/or an embedded SIM, and may contain unique identification information (for example, an Integrated Circuit Card Identifier (ICCID)) or subscriber information (for example, an International Mobile Subscriber Identity (IMSI)).

The memory 230 (for example, the memory 130) may include, for example, an internal memory 232 and/or an external memory 234. The internal memory 232 may include, for example, at least one of a volatile memory (for example, a DRAM, an SRAM, an SDRAM, or the like) and a non-volatile memory (for example, a One Time Programmable ROM (OTPROM), a PROM, an EPROM, an EEPROM, a mask ROM, a flash ROM, a flash memory, a hard disc drive, or a Solid State Drive (SSD)). The external memory 234 may include a flash drive, for example, a compact flash (CF), a secure digital (SD), a Micro-SD, a Mini-SD, an eXtreme digital (xD), a multi-media card (MMC), a memory stick, and the like. The external memory 234 may be functionally and/or physically connected to the electronic device 201 through various interfaces.

The sensor module 240 may, for example, measure a physical quantity or detect the operating state of the electronic device 201, and may convert the measured or detected information into an electrical signal. The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G a color sensor 240H (for example, a red, green, blue (RGB) sensor), a biometric sensor 240I, a temperature/humidity sensor 240J, an illumination sensor 240K, and an ultraviolet (UV) sensor 240M. Additionally or alternatively, the sensor module 240 may include, for example, an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. In some embodiments, the electronic device 201 may further include a processor, which is configured to control the sensor module 240, as a part of the processor 210 or separately from the processor 210 in order to control the sensor module 240 while the processor 210 is in a sleep state.

The input device 250 may include various input circuitry, such as, for example, and without limitation, a touch panel 252, a (digital) pen sensor 254, a key 256, or an ultrasonic input device 258, or the like. The touch panel 252 may use, for example, at least one of a capacitive type, a resistive type, an infrared type, and an ultrasonic type. Furthermore, the touch panel 252 may further include a control circuit. The touch panel 252 may further include a tactile layer to provide a tactile reaction to a user. The (digital) pen sensor 254 may include, for example, a recognition sheet that is a part of, or separate from, the touch panel. The key 256 may include, for example, a physical button, an optical key, or a keypad. The ultrasonic input device 258 may detect ultrasonic waves, which are generated by an input tool, through a microphone (for example, a microphone 288) to identify data corresponding to the detected ultrasonic waves.

The display 260 (for example, the display 160) may include a panel 262, a hologram device 264, a projector 266, and/or a control circuit for controlling them. The panel 262 may be implemented to be, for example, flexible, transparent, or wearable. The panel 262, together with the touch panel 252, may be configured as one or more modules. According to an embodiment, the panel 262 may include a pressure sensor (or a POS sensor) which may measure a strength of pressure of a user's touch. The pressure sensor may be implemented so as to be integrated with the touch panel 262 or may be implemented as one or more sensors separate from the touch panel 262. The hologram device 264 may show a three dimensional image in the air using a light interference. The projector 266 may display an image by projecting light onto a screen. The screen may be located, for example, in the interior of, or on the exterior of, the electronic device 201.

The interface 270 may include various interface circuitry, such as, for example, and without limitation, an HDMI 272, a USB 274, an optical interface 276, or a D-subminiature (D-sub) 278, or the like. The interface 270 may be included in, for example, the communication interface 170 illustrated in FIG. 1. Additionally or alternatively, the interface 270 may, for example, include a mobile high-definition link (MHL) interface, a secure digital (SD) card/multi-media card (MMC) interface, or an infrared data association (IrDA) standard interface.

The audio module 280 may convert, for example, sound into an electrical signal, and vice versa. At least some elements of the audio module 280 may be included, for example, in the input/output interface 150 illustrated in FIG. 1. The audio module 280 may process sound information that is input or output through, for example, a speaker 282, a receiver 284, earphones 286, the microphone 288, and the like. The camera module 291 is a device that can photograph a still image and a moving image. According to an embodiment, the camera module 291 may include one or more image sensors (for example, a front sensor or a rear sensor), a lens, an image signal processor (ISP), or a flash (for example, an LED or xenon lamp). The power management module 295 may manage, for example, the power of the electronic device 201. According to an embodiment, the power management module 295 may include a power management integrated circuit (PMIC), a charger IC, or a battery or fuel gauge. A PMIC or a charger IC may have a wired and/or wireless charging method. Examples of the wireless charging method may include a magnetic resonance method, a magnetic induction method, an electromagnetic wave method, and the like. Additional circuits (for example, a coil loop, a resonance circuit, a rectifier, and the like) for wireless charging may be further included. The battery gauge may measure, for example, the remaining charge of the battery 296 and a voltage, current, or temperature while charging. The battery 296 may include, for example, a rechargeable battery and/or a solar battery.

The indicator 297 may display a particular state, for example, a booting state, a message state, a charging state, or the like of the electronic device 201 or a part (for example, the processor 210) of the electronic device 201. The motor 298 may convert an electrical signal into a mechanical vibration and may generate vibration or haptic effects. The electronic device 201 may include a mobile TV support device (for example, GPU) that can process media data according to a standard, such as digital multimedia broadcasting (DMB), digital video broadcasting (DVB), mediaFlo™, or the like. Each of the above-described elements according to the present disclosure may be configured with one or more components, and the names of the corresponding elements may vary based on the type of electronic device. In various embodiments, an electronic device (for example, the electronic device 201) may omit some elements or may further include additional elements, or some of the elements of the electronic device may be combined with each other to configure a single entity, in which case the electronic device may identically perform the functions of the corresponding elements prior to the combination thereof.

Figure 3:
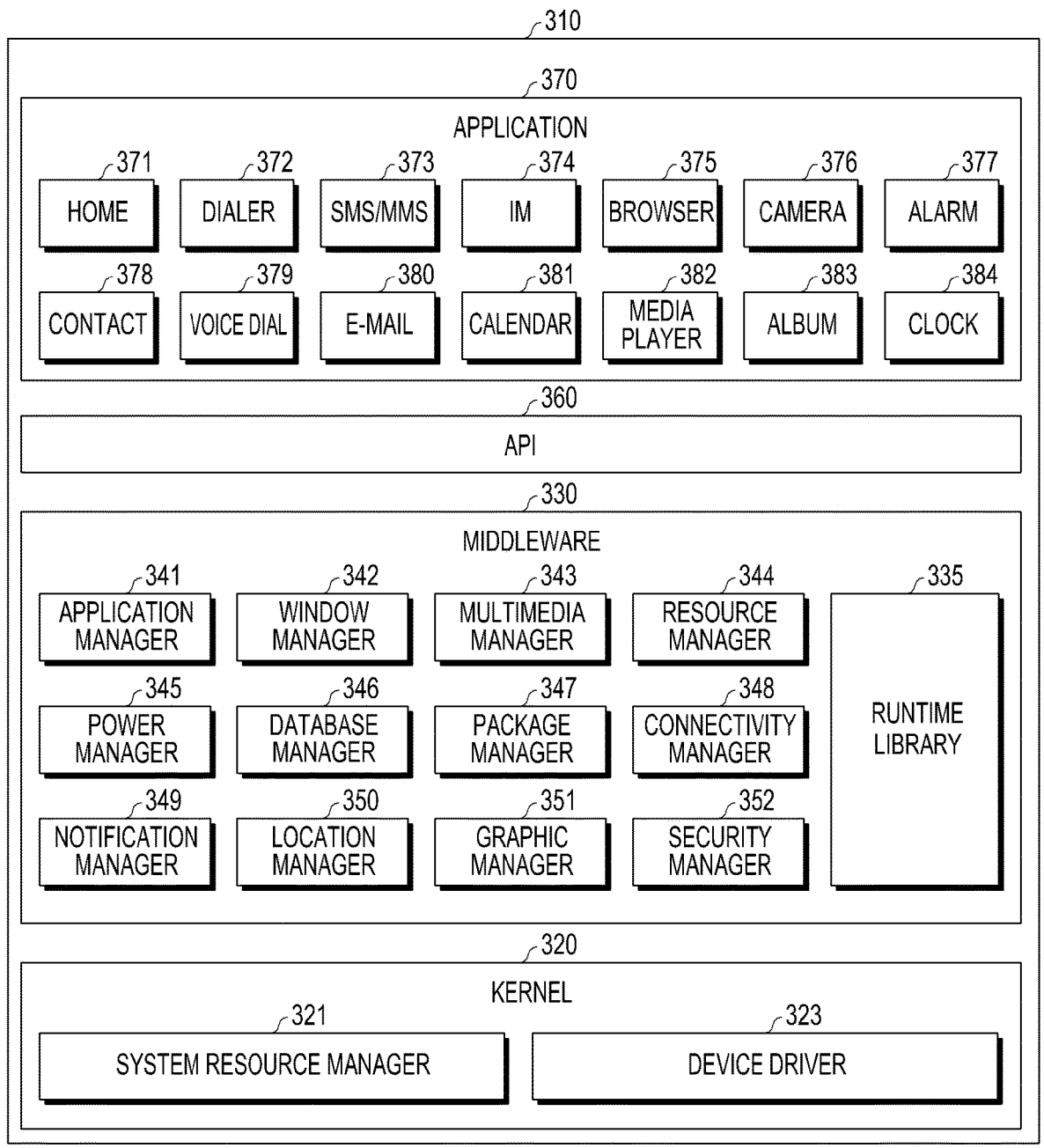
FIG. 3 is a block diagram illustrating an example program module according to various example embodiments.

FIG. 3 is a block diagram illustrating an example program module according to various example embodiments.

According to an embodiment, the program module 310 (for example, the program 140) may include an Operating System (OS) that controls resources relating to an electronic device (for example, the electronic device 101) and/or various applications (for example, the application programs 147) that are driven on the operating system. The operating system may include, for example, Android™, iOS™, Windows™, Symbian™, Tizen™, or Bada™.

Referring to FIG. 3, the program module 310 may include a kernel 320 (for example, the kernel 141), middleware 330 (for example, the middleware 143), an API 360 (for example, the API 145), and/or applications 370 (for example, the application programs 147). At least a part of the program module 310 may be preloaded on the electronic device, or may be downloaded from an external electronic device (for example, the electronic device 102 or 104 or the server 106).

The kernel 320 may include, for example, a system resource manager 321 and/or a device driver 323. The system resource manager 321 may control, allocate, or retrieve system resources. According to an embodiment, the system resource manager 321 may include a process manager, a memory manager, or a file system manager. The device driver 323 may include, for example, a display driver, a camera driver, a Bluetooth driver, a shared memory driver, a USB driver, a keypad driver, a WiFi driver, an audio driver, or an Inter-Process Communication (IPC) driver.

The middleware 330 may provide, for example, a function required by the applications 370 in common, or may provide various functions to the applications 370 through the API 360 such that the applications 370 can efficiently use limited system resources within the electronic device. According to an embodiment, the middleware 330 may include at least one of a runtime library 335, an application manager 341, a window manager 342, a multi-media manager 343, a resource manager 344, a power manager 345, a database manager 346, a package manager 347, a connectivity manager 348, a notification manager 349, a location manager 350, a graphic manager 351, and a security manager 352. The runtime library 335 may include, for example, a library module that a compiler uses in order to add a new function through a programming language while the applications 370 are being executed. The runtime library 335 may manage input/output, manage memory, or process arithmetic functions. The application manager 341 may manage, for example, the life cycles of the applications 370. The window manager 342 may manage GUI resources used for a screen. The multimedia manager 343 may identify formats required for reproducing various media files and may encode or decode a media file using a codec suitable for the corresponding format. The resource manager 344 may manage the source code of the applications 370 or space in memory. The power manager 345, for example, may manage the capacity, temperature, or power of a battery and may determine or provide power information required for operation of the electronic device by using the said information. According to an embodiment, the power manager 345 may operate in conjunction with a basic input/output system (BIOS). The database manager 346 may, for example, generate, search, or change databases to be used by the applications 370. The package manager 347 may manage the installation or update of an application that is distributed in the form of a package file.

The connectivity manager 348 may manage, for example, a wireless connection. The notification manager 349, for example, may provide, to a user, an event, such as an arrival message, an appointment, and a proximity notification. The location manager 350 may manage, for example, the location information of the electronic device. The graphic manager 351, for example, may manage a graphic effect to be provided to a user or a user interface relating to the graphic effect. The security manager 352 may provide, for example, system security or user authentication. According to an embodiment, the middleware 330 may include a telephony manager for managing a voice or video call function of the electronic device or a middleware module that is capable of forming a combination of the functions of the above-described elements. According to an embodiment, the middleware 330 may provide specialized modules according to the types of operating systems. Furthermore, the middleware 330 may dynamically remove some of the existing elements, or may add new elements.

The API 360 may, for example, be a set of API programming functions, and may be provided with different configurations depending on the operating system. For example, in the case of Android or iOS, one API set may be provided for each platform, and in the case of Tizen, two or more API sets may be provided for each platform.

Figure 4:
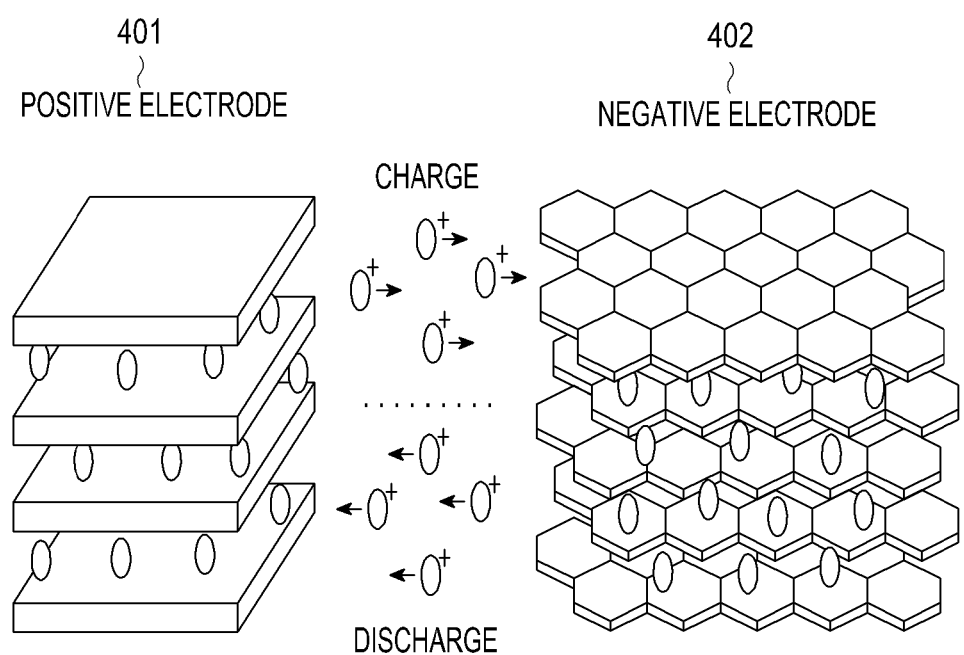
FIG. 4 is a diagram illustrating example charge and discharge of a battery according to various example embodiments.

The applications 370 may include an application, such as a home 371, a dialer 327, an SMS/MMS 373, an Instant Message (IM) 374, a browser 375, a camera 376, an alarm 377, a contacts 378, a voice dial 379, an email 380, a calendar 381, a media player 382, an album 383, a clock 384, or the like. Although not illustrated, the applications 370 may include various other applications, such as, for example, and without limitation, health care (e.g., measuring of workrate, blood glucose, or the like), or provision of environmental information (e.g., atmospheric pressure information, humidity information, temperature information, or the like). According to an embodiment, the applications 370 may include an information exchange application that can support the exchange of information between the electronic device and an external electronic device. The information exchange application may include, for example, a notification relay application for relaying particular information to an external electronic device or a device management application for managing an external electronic device. For example, the notification relay application may relay notification information generated in the other applications of the electronic device to an external electronic device, or may receive notification information from an external electronic device to provide the received notification information to a user. The device management application may, for example, install, delete, or update a function (for example, a function of turning on/off the external electronic device itself (or some components thereof) or a function of adjusting the luminance (or resolution) of a display) of an external electronic device communicating with the electronic device, or applications operating in the external electronic device. According to an embodiment, the applications 370 may include applications (for example, a health care application of a mobile medical appliance) that are designated according to the attributes of an external electronic device. According to an embodiment, the applications 370 may include applications received from an external electronic device. At least some of the program module 310 may be implemented (for example, executed) by software, firmware, hardware (for example, the processor 210), or a combination of two or more thereof and may include a module, a program, a routine, an instruction set, or a process for performing one or more functions. FIG. 4 is a diagram illustrating an example configuration of a battery and charge and discharge of a battery according to various example embodiments.

According to various embodiments, a battery may be a battery based on a compound (intercalation compounds) of a material having a layer structure. According to an embodiment, a battery may be a lithium ion battery, and a compound of a lithium ion battery may be a material including a crystal structure of a layer structure which allows the movement of a lithium ion from a layer or the existence of a lithium ion between layers. The lithium ion battery may include a positive electrode 401 and a negative electrode 402. An electrode material used as a positive electrode 401 may include a crystal structure including a space into and from which lithium ions can easily enter and leave and may include an oxide or a phosphate containing a metal ion that can be oxidized and reduced. For example, a material used as a positive electrode 401 may be any one of lithium cobalt oxide ($LiCoO_2$), lithium iron phosphate ($LiFePO_4$), and lithium manganese oxide ($LiMn_2O_4$). An electrode material used as a negative electrode 402 may include a material including a crystal lattice and may be any one of metal lithium and graphite, or any one of a lithium-titanate crystal and a silicon-graphite composite.

According to various embodiments, a battery may be connected to any of various electronic devices and may be connected to an electronic device to perform charging and discharging operations. For example, when a battery is connected to an electronic device, a spontaneous chemical reaction, i.e., discharge, may start in the battery. For example, when a battery is discharged, an oxidation reaction in which lithium metal included in an electrode material of a negative electrode 402 is oxidized to generate lithium ions occurs spontaneously, so that electrons are generated together with the lithium ions of the negative electrode and the generated electrons may move to a positive electrode through a circuit. The electrons having moved to the positive electrode 401 reduce metal ions included in an electrode material of the positive electrode 401. As the metal ions are reduced, lithium ions in an electrolyte may be absorbed into the positive electrode 401. A battery can supply power to a load according to the principle by which ions move to a positive electrode 401 when the battery is discharged. In addition, when the battery is charged, the metal ions included in the positive electrode 401 are oxidized. Further, lithium ions are released from the positive electrode 401 by the quantity of electric charges of the positive electrode increased as a result of the oxidation. In the negative electrode 402, the lithium ions are reduced to a lithium metal and thus may return to a state of an original material of the negative electrode.

According to an embodiment, a speed at which a battery is charged may be indicated by charging rate C. 1 C may be identical to a maximum current which a battery can supply during one hour. For example, in a 2000 mAhr battery, C may be identical to 2 A, and when a charge current of 1 A is applied to the 2000 mAhr battery, the battery may be charged by 0.5 C.

A charging rate may be proportional to a charge current. As a charge current is increased, a charging rate can be increased. However, ions in a battery have limited mobility. Therefore, even when a charge current is continually increased, a charging rate may be not continually increased. For example, when a charge current is equal to or larger than a predetermined threshold value, the charging rate may not be increased. In a state where a charging rate is not increased, a high charge current causes the generation of heat energy or insertion of many ions into a negative electrode. In case where heat energy is generated, the internal temperature of the battery is increased to cause ignition, etc., thereby causing permanent damage to the battery. In case where many ions are inserted into a negative electrode, the electrode is decomposed, thus damaging the battery. Although it is possible to use a high charge current through improvement of the ion mobility of the battery, there is a limitations. Therefore, control of a proper charge current and a proper charging time for the battery may be required.

According to various embodiments, an electronic device can control charge current and voltage provided to a battery in accordance with a charging profile. The charging profile may be determined based on various standards depending on the characteristics and types of each of an electronic device and a battery.

Figure 5:
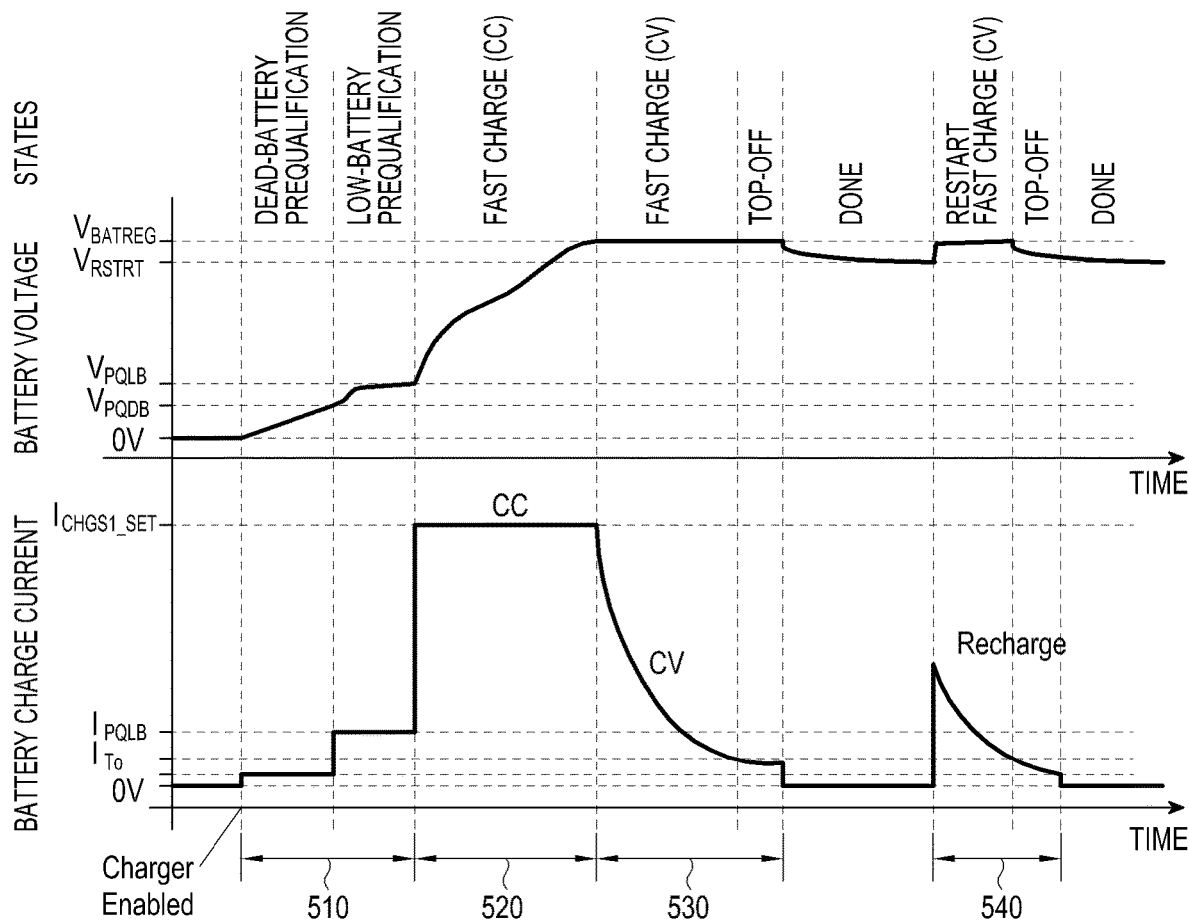
FIG. 5 is a graph illustrating battery voltage and charge current corresponding to a battery charging profile according to an example embodiment.

FIG. 5 is a graph illustrating an example of battery voltage and charge current corresponding to a charging profile according to an example embodiment.

According to an embodiment, an electronic device may control to supply a charge current according to the charging profile illustrated in FIG. 5 in order to minimize and/or reduce deterioration of the performance of the battery and ensure stability and a long lifespan.

Referring to FIG. 5, a charging profile graph has a vertical axis which may indicate a charge current (battery charge current) and a battery voltage, and has a horizontal axis which may indicate time. According to a charging profile according to an embodiment, a plurality of sections may exist in order to provide different charge currents depending on the battery voltage. According to various embodiments, the plurality of sections may include a prequalification section 510 (referred to as a "pre-charge section"), a Constant Current (CC) section 520, a Constant Voltage (CV) section 530, and a recharge section 540 (referred to as an "auxiliary charge section").

The prequalification section 510 corresponds to a state where the voltage of a battery is over-discharged to below a specified first voltage ($V_{PQLB}$)(for example, about 3.1 V). When a high charge current is supplied to the over-discharged battery, the stability of the battery may degrade. Therefore, the prequalification section may be a section of supplying, to the battery, a current equal to or less than a specified first charge current ($I_{PQLB}$). According to an embodiment, a first charge current ($I_{PQLB}$) is equal to or less than a charge current corresponding to about 10% (about 0.1 C) of a charge current supplied to a fully-charged battery. The prequalification section 510 may include a dead-battery prequalification section and a low-battery prequalification section. Depending on the sections, a current supplied within a specified first charge current ($I_{PQLB}$) may be increased step by step. The voltage of the battery may be gradually increased according to the supply of current equal to or less than the first charge current in the prequalification section 510. When the voltage of the battery becomes equal to or greater than the specified first voltage ($V_{PQLB}$)(for example, a voltage enabling departure from an over-discharged state), the battery may enter a CC section 520.

The CC section 520 may be a section of constantly supplying, to the battery, a second charge current ($I_{CHGS1SET}$) higher than the first charge current ($I_{PQLB}$). As a second charge current ($I_{CHGS1SET}$) is supplied to the battery, the voltage of the battery may increase more quickly. When the voltage of the battery reaches a pre-specified second voltage ($V_{BATREG}$) (for example, about 4.35 V or about 4.4 V, as a fully-charged voltage), the battery may enter a CV section 530.

The CV section 530 may be a section in which the voltage is maintained at a second voltage ($V_{BATREG}$) and a charge current supplied to the battery is decreased. When a charge current supplied to the battery is decreased and then becomes a specified third charge current ($I_{TO}$) (for example, about 0.1 C), the supply of charge current to the battery may be stopped. As the supply of the charge current to the battery is stopped, the battery may be discharged. When the voltage of the battery becomes a specified third voltage ($V_{RSTRT}$) (for example, an auxiliary charge starting voltage) as the battery is discharged, the battery may enter an auxiliary charge section 540.

The auxiliary charge section 540 may be a section of temporarily supplying a charge current until the voltage of the battery becomes a second voltage ($V_{BATREG}$).

According to various embodiments, in a case where leakage current occurs in a battery itself even when a battery is charged according to a charging profile, a charge current exceeding a charge current according to a specified charging profile may be required, or a charging time may take longer than a specified time. When a charge current exceeding a specified charge current is provided to the battery or a charging time takes longer than a specified time, overcharge current causes increase in internal temperature of the battery and decomposition of an electrode, thereby damaging the battery.

According to various example embodiments, an electronic device may include: a display; a communication circuit; a battery; a current sensor that measures (is configured to measure) a charge current used for charging the battery; and a processor, wherein the processor may be configured to measure a charge current using the current sensor, to determine a leakage state of the battery based on at least a part of the charge current, and to provide information corresponding to the leakage state through the display and/or perform a specified function corresponding to the leakage state based on at least a part of the leakage state.

According to an example embodiment, the processor may be configured to perform an operation of determining the leakage state further based on status information on the electronic device, to provide first information corresponding to a first specified state when the leakage state is the first specified state, as at least a part of the notification, and to perform a function corresponding to a second specified state when the leakage state is the second specified state, as at least a part of the specified function.

According to an example embodiment, the processor may be configured to identify, as the charge current, a current measured based on at least a part of a specified time period (period of time).

According to an example embodiment, the processor may be configured to identify, as at least a part of the status information, a temperature corresponding to the electronic device (for example, the internal temperature or the external temperature of the electronic device), the number of times of charging of the battery, and/or the number of times of discharging of the battery.

According to an example embodiment, the processor may be configured to adjust, as at least a part of an operation of performing the specified function, at least one function relating to charging of the battery.

According to an example embodiment, the processor may be configured to transmit at least one of the status information and attribute information of the charge current to an external device using the communication circuit.

According to an example embodiment, the electronic device may further include a memory that stores a charging profile, wherein the processor may be configured to measure the charge current during a time period specified based on at least a part of the charging profile.

According to an example embodiment, the processor may be configured to perform an operation of determining an excess capacity supplied to the battery, of determining a leakage current based on at least a part of the excess capacity, and of determining the leakage state based on at least a part of the leakage current.

According to an example embodiment, the processor may be configured to receive, from an external device, as at least a part of the status information, state information corresponding to an operation state of the battery, determined in the external device.

According to various example embodiments, an electronic device may include: a display; a communication circuit; a battery; a current sensor; and a processor, wherein the processor may be configured to measure a charge current used for charging the battery using the current sensor, to determine a current leakage state of the battery based on at least a part of the charge current and/or status information on the electronic device, when the current leakage state is a first state, to provide a notification corresponding to the first state through the display, and to limit at least one function relating to the charging of the battery when the current leakage state is a second state.

Figure 6:
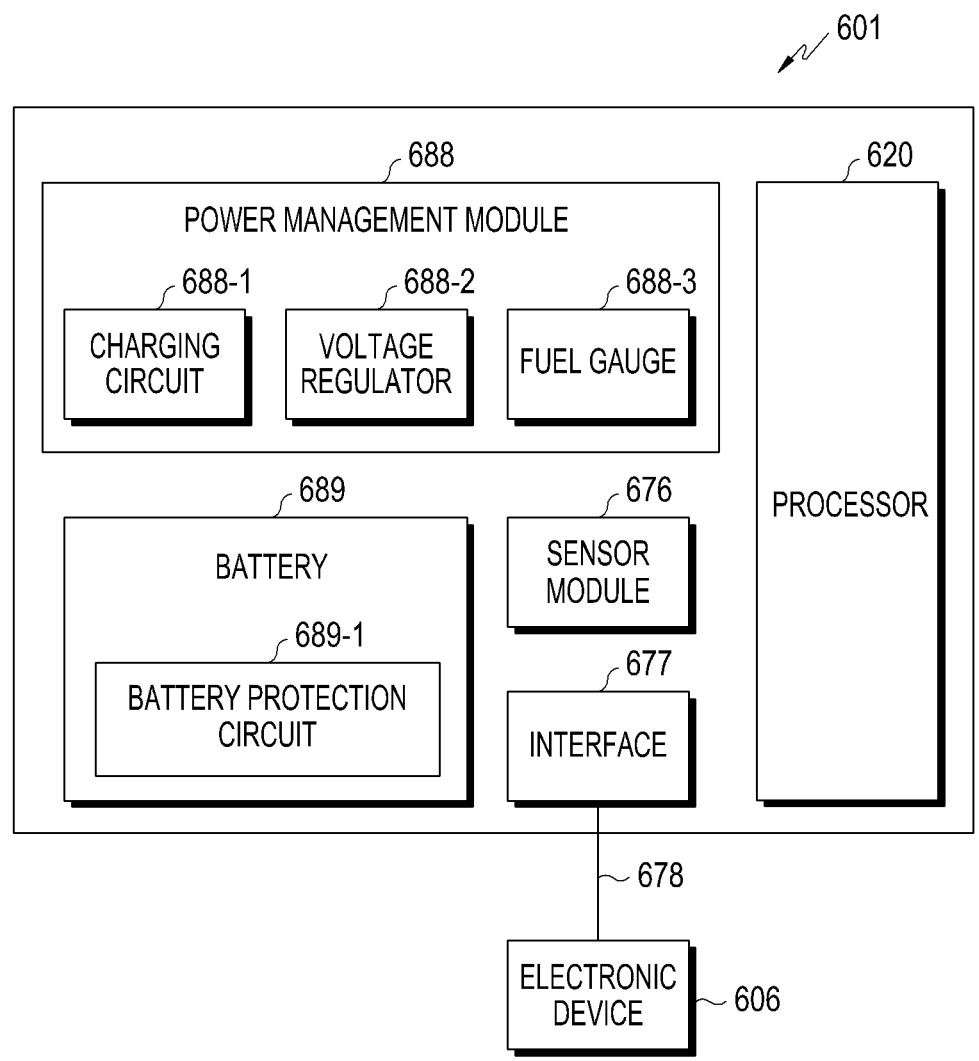
FIG. 6 is a block diagram illustrating an example electronic device according to various example embodiments.

FIG. 6 is a block diagram illustrating an example electronic device according to various example embodiments.

Referring to FIG. 6, an electronic device 601 according to an embodiment may include a part or the entirety of the electronic device 101 illustrated in FIG. 1 or the electronic device 201 illustrated in FIG. 2. The electronic device 601 may include a processor 620, a sensor module 676, an interface 677, a power management module 688, and a battery 689.

The processor 620 may include the entirety or a part of the processor 120 illustrated in FIG. 1 or the processor 210 illustrated in FIG. 2 according to an embodiment. The processor 620 may include various processing circuitry and perform calculations or data processing on control and/or communication of at least one other element of the electronic device 601. The processor 620 may control a plurality of hardware and/or software elements connected thereto and may perform various data processing and operations by driving an operating system or an application program. The processor 620 may control the current sensor (for example, a current sensor in the power management module 688) to measure a charge current of the battery 689 and may determine a leakage state of the battery 689 in accordance with the measured charge current. Then, the processor 620 may perform a control to provide information corresponding to the leakage state or to perform a function corresponding to the leakage state. According to various embodiments, the electronic device may provide information corresponding to the leakage state through a communication unit (communication circuit) to an external device. According to an embodiment, an external device may be another electronic device (for example, the electronic device 102 in FIG. 1) which can establish Peer to Peer (P2P) connection with the electronic device 601, or another electronic device (for example, the electronic device 104 in FIG. 1) or a server (for example, the server 106 in FIG. 1) which can be connected through a network (for example, the network indicated by reference numeral 162 in FIG. 1). For example, the another electronic device may be a wearable device.

According to various embodiments, the processor 620 may measure a charge current used for charging the battery and may determine a leakage state based on the measured charge current.

According to an embodiment, the processor 620 may specify a time period based on a battery charging profile, determine an magnitude of a leakage current based on a charge current measured using each specified time period, and determine a leakage state based on the magnitude of leakage current.

According to an embodiment, the processor 620 may calculate a leakage current value based on an excessive charging amount supplied to the battery and determine a leakage state based on the magnitude of the leakage current based on the leakage current value.

According to an embodiment, the processor 620 may determine a leakage state based on the measured charge current and status information. According to various embodiments, the status information may be at least one of a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device, or the like. The processor 620 may identify at least one of a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device, or the like. The processor 620 may enable a memory 650 to accumulatively store at least one of a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device, or the like. According to various embodiments, other information relating to the status of the electronic device, beyond those described above, may be further stored.

According to various embodiments, the processor 620 may perform a specified function corresponding to a leakage state. According to an embodiment, the processor 620 may perform a function of providing information corresponding to a leakage state and/or may perform a specified function corresponding to a leakage state. According to various embodiments, when a leakage state is a first specified state, the electronic device may provide first information corresponding to the first specified state, as at least a part of the notification, or when a leakage state is a second specified state, the electronic device may perform a function corresponding to the second specified state, as at least a part of the specified function. For example, the first specified state may be a warning state and the second specified state may be a danger state. The warning state may be a state of a warning stage of providing notification of the fact the battery state may be dangerous. The danger state may be a state of a danger stage of providing notification of the fact that the battery state is dangerous. A standard for determining whether a leakage state belongs to a first specified state or a second specified state may be variously specified according to influence which the magnitude of a leakage current or a combination of the magnitude of a leakage current and status information exerts on the electronic device. The electronic device may configure a leakage state to any one of a greater variety of states other than the warning state and the danger state. According to various embodiments, the first information may be information indicating that the battery is abnormal, information recommending a visit to a service center, or information indicating that some functions may be limited. Also, the first information may be a combination of the pieces of information. The first information can be any information which can warn of leakage of the battery, other than the pieces of information.

According to various embodiments, a specified function may include a function relating to battery charging and/or a function of limiting some of various functions of the electronic device. According to an embodiment, a function relating to battery charging may include at least one of a function of lowering a fully-charged voltage of the battery from a first fully-charged voltage (for example, 4.4 V) to a second fully-charged voltage (for example, 4.2 V) which is slightly lower than the first fully-charged voltage, and a function of limiting charging only up to an SOC of 60%. According to an embodiment, a function of limiting some functions may include a function of limiting some of various functions (for example, H/W resource limit, clock speed, etc., other than a call function) of the electronic device. According to an embodiment, a specified function may further include a function of, when the temperature of the battery is high based on the leakage state, terminating an application which is being executed in the electronic device, a function of, when the temperature of the battery is low based on the leakage state, executing an application which has been stopped, and a function of performing or restoring a prevention function based on the leakage state.

According to various embodiments, the processor 620 may receive control information for controlling to perform a specified function corresponding to a leakage state, from an external device (for example, the electronic device 102 in FIG. 1), or another electronic device (for example, the electronic device 104 in FIG. 1) or a server (for example, the server 106 in FIG. 1) which can be connected through a network (for example, the network indicated by reference numeral 162 in FIG. 1) and may perform the specified function corresponding to the received control information.

According to an embodiment, the sensor module 676 may include the entirety or a part of the sensor module 240 illustrated in FIG. 2. According to an embodiment, the sensor module 676 may include a temperature sensor which can measure at least one of the internal temperature of the electronic device 601, the external temperature of the electronic device 601, the temperature of the battery 689, and the temperature of the charging circuit 688-1. According to an embodiment, the sensor module 676 may be included in a battery protection circuit 689-1 as a part thereof and may be disposed in a vicinity of the battery 689, or may be disposed in a vicinity of the battery 689 as a separate module.

According to an embodiment, the interface 677 may include the communication interface 170 illustrated in FIG. 1 or the entirety or a part of the interface 270 illustrated in FIG. 2. The interface 677 may include a wired interface or a wireless interface according to various embodiments. For example, a wired interface may be a Universal Serial Bus (USB) interface and a wireless interface may be a wireless charging interface. According to an embodiment, the electronic device 601 may receive data or power from the external electronic device 606 or may provide data or power to the external electronic device 606 based on a protocol (for example, a USB protocol or a wireless charging protocol) determined according to the type of the interface 677.

According to an embodiment, the power management module 688 may include the entirety or a part of the power management module 295 in FIG. 2 or the power manager 345 in FIG. 3. According to an embodiment, the power management module 688 may include a charging circuit 688-1, a voltage regulator 688-2, and/or a fuel gauge 688-3. In the power management module 688, some elements (for example, the fuel gauge 688-3) may be omitted or other elements may be additionally included. According to an embodiment, the charging circuit 688-1, the voltage regulator 688-2, or the fuel gauge 688-3 may be configured as a module separate from the power management module 688. According to an embodiment, the power management module 688 may include an Power Management Integrated Chip (PMIC) and may further include an I/F PMIC (InterFace Power Management Integrated Chip).

The charging circuit 688-1 according to an embodiment may include a plurality of charging circuits. For example, a charging circuit may include a combination of one or more wired charging circuits and a wireless charging circuit, or a combination of a plurality of wired charging circuits.

According to an embodiment, the charging circuit 688-1 may receive power provided from the external electronic device 606, to charge the battery 689 or may perform a discharging operation by using power from the battery 689. According to an embodiment, the charging circuit 688-1 may perform a charging and discharging operation according to a charging profile. According to various embodiments, the external electronic device 606 may be an external power supply device (for example, a wired charger or a wireless charger) that provides power from the outside. According to an embodiment, the charging circuit 688-1 may perform a fast charging of the battery 689, based on the type of the external electronic device 606 or the amount of power which can be supplied from the external electronic device 606. For example, when the external electronic device 606 is a wired charger, for example, a power adapter, or when the amount of power which can be supplied from the external electronic device 606 is equal to or more than 20 W, the charging circuit 688-1 can provide a charge current corresponding to the fast charging to the battery 689.

The voltage regulator 688-2 may include, for example, and without limitation, a Low DropOut regulator, and a switching regulator, or the like. According to an embodiment, the voltage regulator 688-2 may generate power sources having various voltage levels by using the Low DropOut regulator or the switching regulator, and may provide the generated power sources to elements included in the electronic device. According to an embodiment, the voltage regulator 688-2 may generate power sources having various voltage levels according to various voltage levels required for respective hardware components included in the electronic device 601 by using received power, and may provide powers using various generated power sources to hardware components having voltage levels corresponding to the respective power sources.

The fuel gauge 688-3, for example, may measure first state information (for example, the capacity, the number of times of charging or discharging, the temperature, or the voltage of the battery) of the battery 689, and may provide, to the processor 620, the first state information or second state information (for example, lifespan, overvoltage, low voltage, overcurrent, overcharge, excessive heat, short-circuit, or swelling) of the battery 689, determined at least based on the first state information. The processor 620 may control the charging circuit 688-1 at least based on the second state information. According to an embodiment, when determining that the battery 689 is in an abnormal state based on the second state information, the processor 620 may stop a charging operation of the charging circuit 688-1 for battery 689.

The battery 689, according to an embodiment, may include a secondary battery (for example, a nickel battery, a lithium ion battery, or a lithium polymer battery). The battery 689 may include a battery protection circuit 689-1 in order to reduce degradation in the performance of the battery 689.

The battery protection circuit 689-1 (Protection Circuit Module (PCM)) may prevent burning of the battery 689 due to, for example, the overvoltage, the overcurrent, the excessive heat, the overdischarge, or the short-circuit of the battery 689. According to an embodiment, the battery protection circuit 689-1 may include a Battery Management System (BMS) that performs a function (for example, cell balancing, measuring of the capacity of the battery, measuring of the number of times of charging or discharging, temperature measurement, or voltage measurement) other than a function of protecting the battery 689.

According to an embodiment, the electronic device 601 may further include a display, a memory, and a communication unit (not shown).

The display may include the display 160 illustrated in FIG. 1 or the entirety or a part of the display 260 illustrated in FIG. 2, according to an embodiment. The display may provide information corresponding to a leakage state according to the control of the processor 620. According to various embodiments, the display may provide a notification corresponding to a leakage state. The notification may be provided through various schemes, such as an image, text, video, etc. For example, the display may provide a notification of indicating the fact that the battery is abnormal, a notification of recommending a visit to a service center, or a notification indicating that some functions may be limited, in accordance with a leakage state. In addition, the display may display a combination of the notifications.

The memory may include the entirety or a part of the memory 130 illustrated in FIG. 1 or the memory 230 illustrated in FIG. 2, according to an embodiment. The memory may store a program and instructions required for operating the processor 620. The memory may accumulate leakage states and store the accumulated leakage states, and may store status information including at least one piece of information among a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device.

The communication unit may be a communication circuit, and may include the communication interface 170 illustrated in FIG. 1 or the entirety or a part of the communication module 220 illustrated in FIG. 2, according to an embodiment. According to various embodiments, the communication unit may transmit, to an external device, at least one of status information and attribute information of a charge current based on a charge current detected by the sensor module 676. According to an embodiment, an external device may be another electronic device (for example, the electronic device indicated by 102 in FIG. 1) which can establish Peer to Peer (P2P) connection with the electronic device 601, or another electronic device (for example, the electronic device 104 in FIG. 1) or a server (for example, the server 106 in FIG. 1) which can be connected through a network (for example, the network indicated by 162 in FIG. 1). For example, the another electronic device may be a wearable device.

Figure 7:
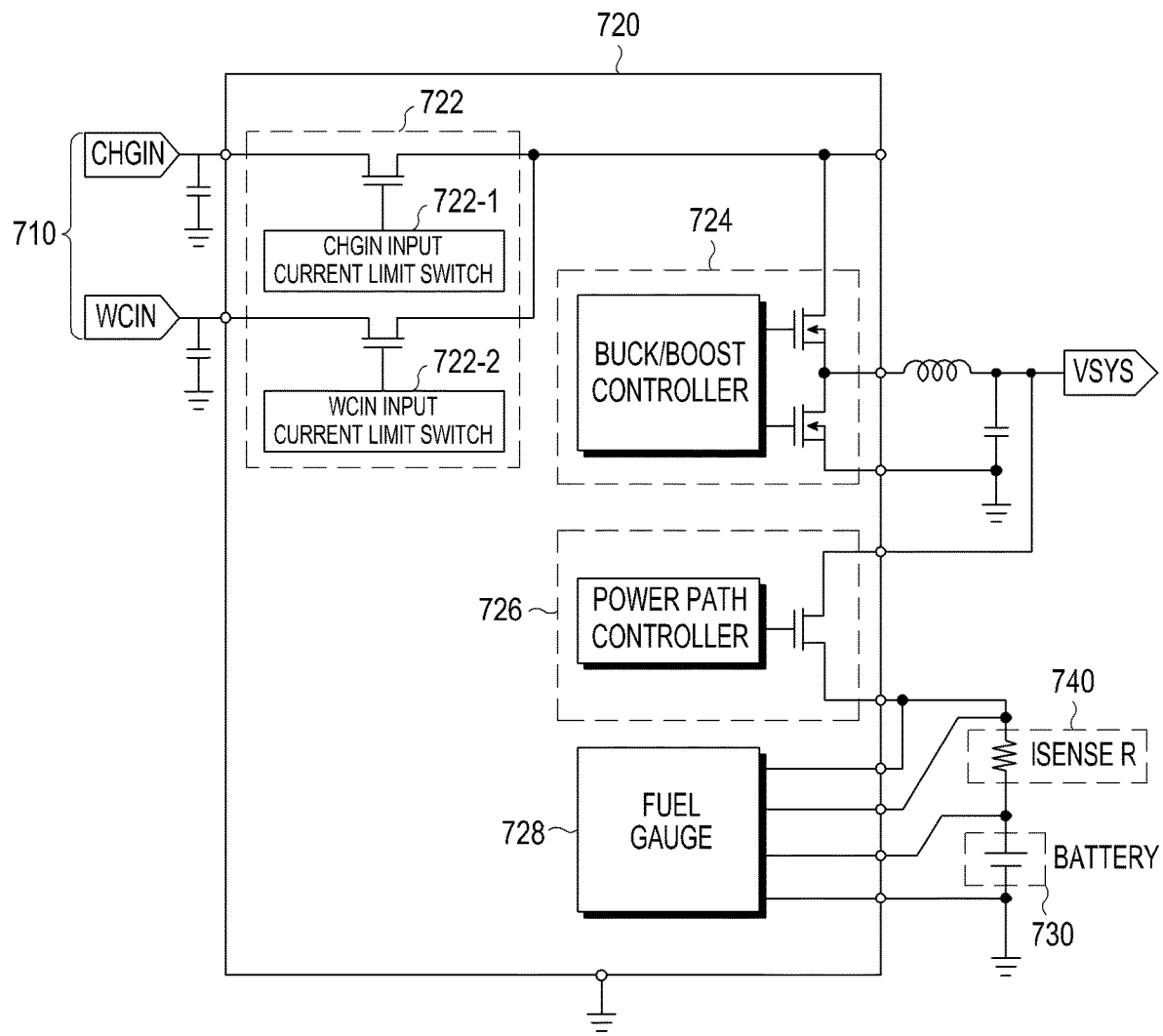
FIG. 7 is a diagram illustrating an example charger IC according to various example embodiments.

FIG. 7 is a diagram illustrating an example charger IC according to various example embodiments.

Referring to FIG. 7, a charger IC 720 according to an embodiment may include the entirety of a part of the power management module 688-1 of FIG. 6.

According to an embodiment, the charger IC 720 may be connected to each of an interface 710 (for example, the interface 677 of FIG. 6), a current sensor 740, and a battery 730 (for example, the battery 296 of FIG. 2, or the battery 689 of FIG. 6).

The interface 710 may include a wired interface (CHGIN: charge interface) and a wireless interface (WCIN: wireless charge interface). The interface 710 may be mounted on a part of a housing of an electronic device (for example, the electronic device 101 in FIG. 1, the electronic device 201 in FIG. 2, or the electronic device 601 in FIG. 6). The wired interface (CHGIN) includes a connector, for example, a Universal Serial Bus (USB) and can be connected by wire to a wired charging device (for example, a Travel Adaptor (TA)) through the connector. The wireless interface (WCIN) includes a coil (for example, a conductive pattern) and a wireless charging IC and may wirelessly transmit power to the wireless charging device (for example, a wireless charging pad, etc.) and may wirelessly receive power from the wireless charging device. The wireless power may be transmitted and received by using a wireless power transmission scheme, such as a magnetic field inductive coupling scheme, a resonant coupling scheme, or a combination thereof.

The charger IC 720 may be electrically connected to the interface 710. According to an embodiment, the charger IC 720 may include an input controller 722, a Buck/Boost control unit 724 (for example, the voltage regulator 688-2 of FIG. 6), a power path control unit 726 (for example, the charging circuit 688-1 of FIG. 6), and a fuel gauge 728 (for example, the fuel gauge 688-3 of FIG. 6).

The input controller 722 may include at least one switch. According to an embodiment, the input controller 722 may include a wired input current limit switch (CHGIN input current limit switch) 722-1 and a wireless input current limit switch (WCIN input current limit switch) 722-2. The wired input current limit switch 722-1 may control the input of current from an external wired device. The wireless input current limit switch (WCIN input current limit switch) 722-2 may control the input of current from an external wireless device.

The Buck/Boost control unit 724 may convert (DC to DC) power input by the input controller 722 into a voltage and a current suitable for charging the battery 730 and may control to convert power from the battery 730 into a voltage and a current suitable for being used in an electronic device. According to various embodiments, the Buck/Boost control unit 724 may control a charge current depending on a battery voltage for each of a prequalification section (for example, the section indicated by reference numeral 510 of FIG. 5), a Constant Current (CC) section (for example, the section indicated by reference numeral 520 of FIG. 5), a Constant Voltage (CV) section (for example, the section indicated by reference numeral 530 of FIG. 5), and a recharge section (for example, the section indicated by reference numeral 540 of FIG. 5) according to a charging profile. According to various embodiments, the Buck/Boost control unit 724 may boost or lower (buck) the voltage of the battery 730 in order to provide a constant current to a system (VSYS) (for example, a system that provides power to each module of the electronic device), or may boost or lower (buck) a provided charging voltage in order to provide a constant charge current to the battery 730. According to an embodiment, the Buck/Boost control unit 724 may include a Buck/Boost controller (for example, a Buck/Boost converter) or may include at least one switch corresponding to a Buck/Boost converter.

The power path control unit (power path controller) 726 may control a power path such that power provided from an external power source is supplied to the battery 730, or may control a power path such that power from the battery 730 is supplied to the system (VSYS). The power path control unit 726 may control a power path such that, in a state where power is supplied from the outside, some of the power from the outside is supplied to the battery 730 and the remainder is supplied to the system (VSYS). For example, the power path control unit 726 may control a power path such that, when power is supplied from an external power source in a state where the power of the electronic device is turned off, the entirety of the supplied power is supplied to the battery 730, and when power is supplied from an external power source in a state where the power of the electronic device is turned on, the power remaining after the supplied power is supplied to the system (VSYS) is supplied to the battery 730. According to an embodiment, the power path control unit 726 may include a power path controller, and/or may include at least one switch corresponding to a power path controller.

The fuel gauge 728 may measure the voltage of the battery 730 and may measure the charge current and the discharge current of the battery 730. According to various embodiments, the fuel gauge 728 may directly sense the voltage between a negative electrode terminal and a positive electrode terminal of the battery 730, or may receive the voltage of the battery sensed by a separate battery voltage sensor. A charge current control according to a charging profile may be performed based on the sensed voltage. According to various embodiments, the fuel gauge 728 may include a current sensor, and may measure the charge current and the discharge current of the battery 730 by using the current sensor. Alternately, the fuel gauge 728 may measure the charge current and the discharge current of the battery 730 through a separate current sensor 740. For example, the separate current sensor 740 may include a resistor circuit (Isense R) connected to the battery 730.

Figure 8:
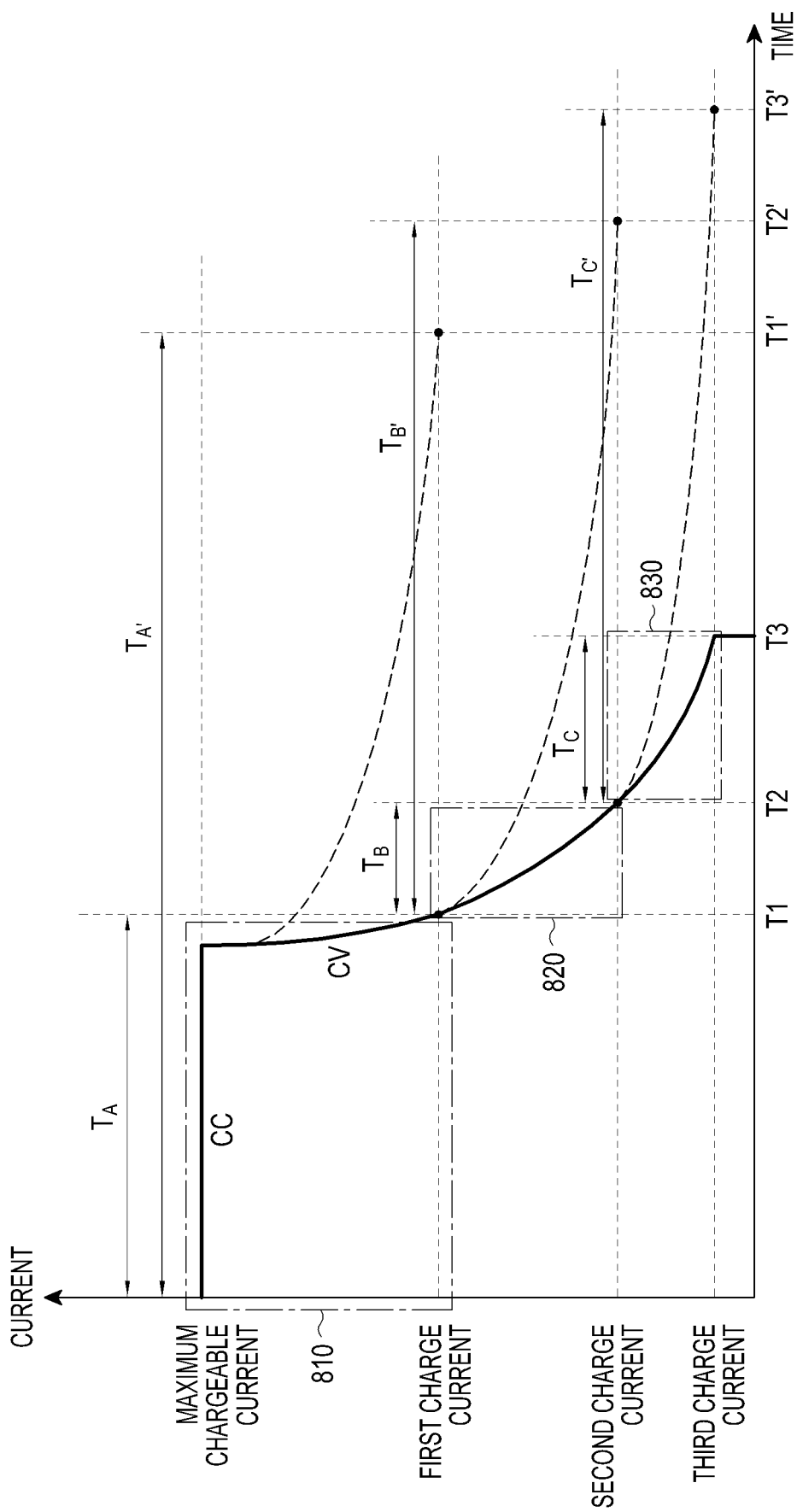
FIGS. 8 and 9 are graphs illustrating examples of at least one time period specified based on a battery charging profile according to various example embodiments.
Figure 9:
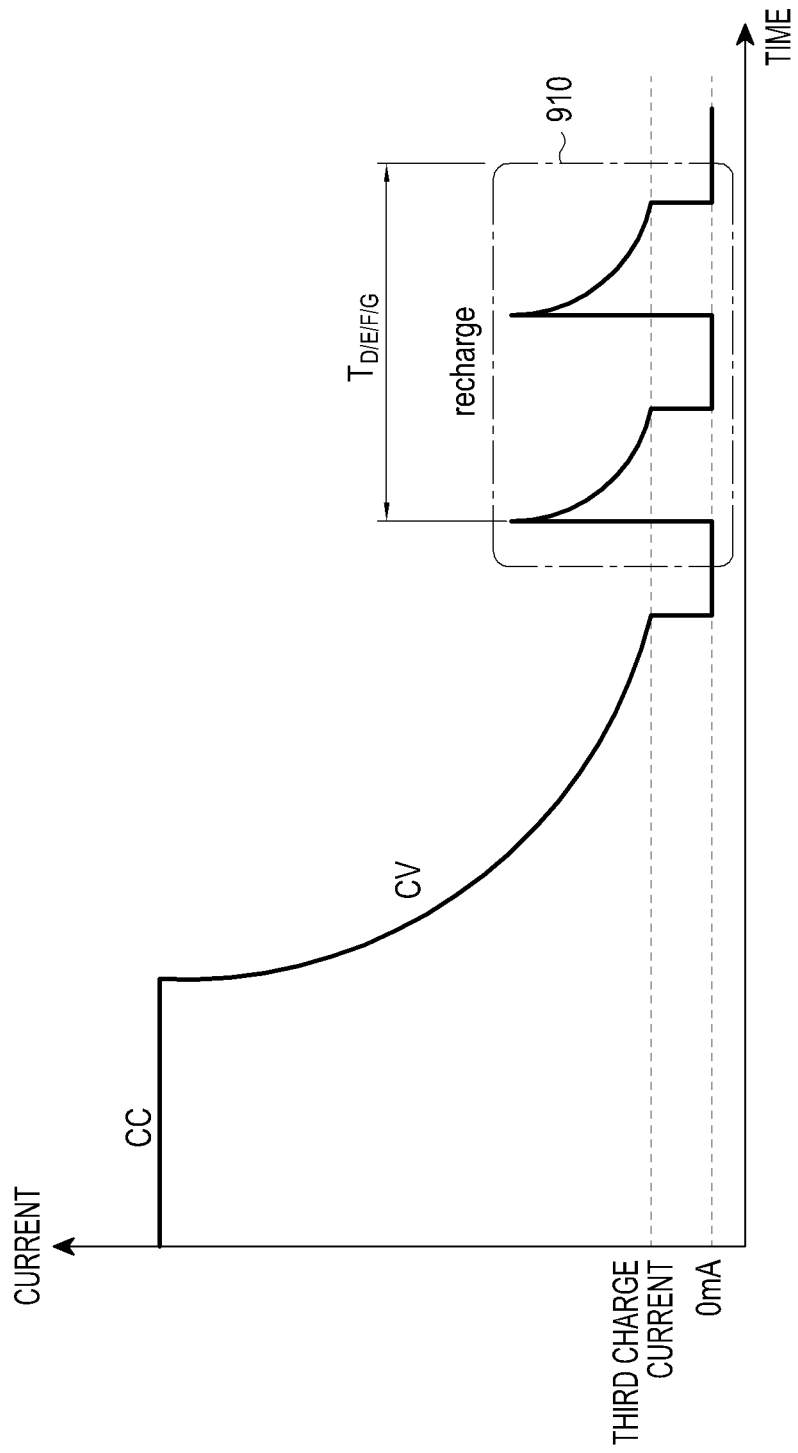

FIGS. 8 and 9 are graphs illustrating examples of at least one time period specified based on a battery charging profile according to various example embodiments.

Referring to FIGS. 8 and 9, a battery charging profile according to an embodiment may include a first time period ($T_A$), a second time period ($T_B$), a third time period ($T_C$), and a fourth time period ($T_{D/E/F/G}$), and a first section 810, a second section 820, a third section 830, and a fourth section 910, which correspond to respective time periods. According to an embodiment, a battery charging profile may be a battery charging profile corresponding to a 5 V lithium ion battery.

According to various embodiments, the first time period ($T_A$) may be a time period corresponding to a first section 810 in which a battery (hereinafter, also referred to as a "normal battery") in a state where a current does not leak therefrom, is charged by a charge current having a value from a maximum chargeable current to a first charge current. For example, a first charge current may be about 1 A and a first time period ($T_A$) may be a value in a range from about three hours to about four and a half hours.

According to various embodiments, the second time period ($T_B$) may be a time period corresponding to a second section 820 in which a normal battery is charged by a charge current having a value from a first charge current to a second charge current. For example, a first charge current may be about 1 A, a second charge current may be a primary full charge termination current (for example, about 350 mA), and a second time period ($T_B$) may be within one hour. According to an embodiment, a primary full charge termination current may be a reference current for displaying a State Of Charge (SOC) of 100% on the display.

According to various embodiments, the third time period ($T_C$) may be a time period corresponding to a third section 830 in which a normal battery is charged by a charge current having a value from a second charge current to a third charge current. According to an embodiment, a second charge current may be a primary full charge termination current.

For example, a primary full charge termination current may be about 350 mA. According to an embodiment, a third charge current may be a secondary full charge termination current. For example, a secondary full charge termination current may be about 150 mA. According to an embodiment, a primary full charge termination current may be a reference current for displaying a State Of Charge (SOC) of 100% on the display, and a secondary full charge termination current may be a reference current for actually terminating a charge. For example, a third time period ($T_C$) may be within one hour.

According to various embodiments, when the charge current of a normal battery is equal to or less than a third charge current, charging may be completed, and when the voltage of the battery lowers from a state in which charging is completed (fully-charged state) to a first voltage (for example, 50 mV) or less, an auxiliary charge may be performed. According to various embodiments, a fourth time period ($T_{D/E/F/G}$) may be a time period corresponding to a fourth section 910 in which an auxiliary charge is performed.

FIG. 10 is a table illustrating examples of a leakage level according to each section according to various example embodiments.

Referring to FIG. 10, an electronic device (for example, the electronic device indicated by 101 of FIG. 1, 201 of FIG. 2, or 601 of FIG. 6) according to an embodiment may determine a leakage level based on a battery charge current measured for each section.

According to various embodiments, when a time period ($T_A$) of a first section (for example, the first section 810 in FIG. 8) in which the battery is charged by a charge current having a value from a maximum chargeable current to a specified first charge current, exceeds a first time period ($T_A$) based on the measured charge current, the electronic device may determine level A, as a leakage level.

According to various embodiments, when a time period ($T_B$) of a second section (for example, the second section 820 in FIG. 8) in which the battery is charged by a charge current having a value from a first charge current to a second charge current, exceeds a second time period ($T_B$) based on the measured charge current, the electronic device may determine level B as a leakage level.

According to various embodiments, when a time period ($T_C$) of a third section (for example, the third section 830 in FIG. 8) in which the battery is charged by a charge current having a value from a second charge current to a third charge current, exceeds a third time period ($T_C$) based on the measured charge current, the electronic device may determine level C as a leakage level.

According to various embodiments, when a time period is a fourth time period ($T_{D/E/F/G}$) corresponding to a fourth section (for example, the fourth section 910 of FIG. 9) in which the charge current of the battery is equal to or less than a third charge current and an auxiliary charge is performed, based on the measured charge current, and the number of times of auxiliary charge is equal to or larger than a predetermined number of times, the electronic device may determine one of levels D/E/F/G as a leakage level. According to various embodiments, as the magnitude of leakage current is increased, the number of times of auxiliary charge may be increased. The case of the largest number of times of auxiliary charge may correspond to level D, and the case of the smallest number of times of auxiliary charge may correspond to level G For example, in level D, the number of times of auxiliary charge may be one or more times in one hour, in level E, the number of times of auxiliary charge may be one or more times in three hours, in level F, the number of times of auxiliary charge may be one or more times in six hours, and in level G, the number of times of auxiliary charge may be one or more times in 12 hours.

According to various embodiments, in a leakage level, the magnitude of leakage current may be increased in accordance with a sequence of levels A, B, C, D, E, F, and G.

According to various embodiments, the time periods may be determined as an embodiment, and may be specified as a greater or smaller number of sections. In the case where the time periods is specified as a greater number of sections, a leakage level can be determined more precisely based on the magnitude of leakage current. Therefore, a leakage level can be determined more precisely based on the magnitude of leakage current.

According to various embodiments, when a capacity supplied to a battery (for example, the battery 296 of FIG. 2, the battery 689 of FIG. 6, or the battery 730 of FIG. 7) exceeds a charging-allowing capacity of the battery, an electronic device (for example, 101 of FIG. 1, 201 of FIG. 2, or 601 of FIG. 6) may determine a leakage level by using a time interval (or excessive charging time) from a time point at which the capacity supplied to the battery exceeds a charging-allowing capacity of the battery, and an excessively supplied capacity (or excessively charged capacity). According to an embodiment, when the supply of charge current starts in a state where a charge-allowing capacity of the battery is 3000 mAhr, the electronic device accumulatively calculates charge current supplied during a charging time to obtain a charge capacity. When the charge capacity exceeds 3000 mAhr, which is a charge-allowing capacity, the electronic device may calculate an excessively charged time from a time point at which excess occurs, and an excessively charged capacity. Then, the electronic device may obtain a leakage current value by dividing the excessively charged capacity by the excessive charging time. The electronic device may determine a leakage level by using a leakage current value. According to an embodiment, the electronic device may determine a leakage level depending on the magnitude of the leakage current value. For example, electronic device may determine, as a leakage level, one level of a plurality of levels according to the magnitude of the leakage current value. For example, the electronic device may determine, as a leakage level, one level of the plurality of levels, in a sequence from the largest leakage current value to the smallest.

According to various embodiments, a leakage level may be accumulated and then stored.

FIGS. 11A, 11B and 11C are diagrams illustrating an example of a leakage level storage table according to various example embodiments.

Referring to FIG. 11A, FIG. 11B, and FIG. 11C, respective electronic devices (for example, Device A, Device B, and Device C) according to an embodiment may accumulate respective leakage levels thereof and then store the accumulated leakage levels.

According to an embodiment, each of Device A, Device B, and Device C may accumulate at least one among the number of times of charging, temperature, and whether to be charged by wire or wirelessly charged, other than a leakage level, and then further store the accumulated information. The number of times of charging may be the number of times that the battery is charged. The temperature may be one of the internal temperature of the electronic device, the external temperature of the electronic device, the temperature of the battery, and the temperature of the charging circuit, and may be the highest temperature among the temperatures. When the battery is charged by wire, "wired" may be stored, and when the battery is charged wirelessly, "wireless" may be stored. According to various embodiments, at least one among the leakage level corresponding to abnormality, the number of times of discharging, the number of times of connection to a wired charging device, and the number of times of connection to a wireless charging device may be accumulated and then further stored. According to an embodiment, at least one among the further stored pieces of information other than the leakage level may be used as status information.

According to an embodiment, the electronic device may determine a leakage state of the battery according to a leakage level. According to an embodiment, the electronic device may determine whether the battery is normal, according to the leakage level and status information.

According to various embodiments, as the number of times of charging and discharging of the battery is increased, the deterioration of the battery may be increased. Therefore, as a battery has a larger number of times of charging and discharging, the battery may have large magnitude of leakage current. According to an embodiment, the number of times of charging and discharging of the battery may be used as status information. According to an embodiment, the number of times of charging and the number of times of discharging may indicate the number of times by which the battery is charged and the number of times by which the battery is discharged after being charged, respectively. According to an embodiment, charging and discharging are repeated according to a cycle. Therefore, one of the number of times of charging and the number of times of discharging may be used as status information, or the number of charge and discharge cycles including charging and discharging may be used as status information.

According to an embodiment, when whether the battery is normal is determined according to the leakage level of the electronic device and the number of times of charging and the number of times of discharging of the battery; for example, even when the leakage levels are the same, the states of the battery may be determined differently as a normal state or an abnormal state depending on the number of times of charging and the number of times of discharging, or a mode according to the fact that the battery is abnormal, for example, may be differently performed as a mode corresponding to a warning state or a mode corresponding to a danger state. For example, in the case where the number of times of charging and discharging is small even when the leakage levels are the same, a mode corresponding to a warning state should be operated, and in the case where the number of times of charging and discharging is large even when the leakage levels are the same, a mode corresponding to a danger state should be operated. According to an embodiment, a mode corresponding to a warning state may be a mode of providing notification of information corresponding to a warning state. Information corresponding to a warning state may be information indicating that the battery is abnormal, information recommending a visit to a service center, or information indicating that some functions may be limited. Also, information corresponding to a warning state may be a combination of the pieces of information and can be any information which can warn of leakage of the battery, other than the pieces of information. According to an embodiment, a mode corresponding to a danger state may be a mode of performing a function relating to battery charging or a function of limiting some of various functions of the electronic device. According to various embodiments, a function relating to battery charging may include at least one of a function of lowering a fully-charged voltage of the battery from a first fully-charged voltage (for example, 4.4 V) to a second fully-charged voltage (for example, 4.2 V) which is slightly lower than the first fully-charged voltage, and a function of limiting charging only up to an SOC of 60%. According to an embodiment, a function of limiting some functions may include a function of limiting some of various functions (for example, H/W resource limit, clock speed, etc., other than a call function) of the electronic device.

According to an embodiment, for example, even when the leakage levels of the battery are the same as in level G, a battery in which the number of times of charging and discharging is less than about 100 times may be determined to be normal. Meanwhile, a battery in which the number of times of charging and discharging is equal to or larger than about 300 times may be determined to be abnormal. Also, even when the leakage levels of the battery are the same as in level G for a battery in which the number of times of charging and discharging is equal to or larger than about 300 times and is less than about 500 times, an operation of displaying a message of providing notification that the battery is abnormal may be performed. Meanwhile, for a battery in which the number of times of charging and discharging is equal to or larger than about 500 times, an operation of displaying a message of providing notification that the battery is abnormal may be performed simultaneously with an operation of blocking charging or an operation of limiting a function.

In an example embodiment, the case where status information corresponds to the number of times of charging and the number of times of discharging has been illustrated. However, status information may further include at least one among frequency of fast charging (for example, the number of times of fast charging), the internal resistance value of the battery, frequency of full charge of the battery (for example, the number of times of full charging of the battery), and frequency of full discharge of the battery (for example, the number of times of full discharging of the battery). Further, the electronic device may perform a mode corresponding to a warning state or a mode corresponding to a danger state on battery leakage by using a leakage state and status information further including at least one among frequency of fast charging, the internal resistance value of the battery, and frequency of full charge of the battery. The status information may further include information relating to factors of deteriorating the battery, other than frequency of fast charging, the internal resistance value of the battery, and frequency of full charge of the battery.

According to an embodiment, the electronic device may determine whether the battery is normal, according to the leakage level and the number of times of fast charging. For example, fast charging may accelerate deterioration of the performance of the battery. Therefore, in the case where the number of times of fast charging is larger than a reference number of times even when the leakage state is normal, the electronic device may perform a mode corresponding to a warning state of providing notification that the battery is abnormal.

According to an embodiment, the electronic device may determine whether the battery is normal, according to the leakage level and the internal resistance value. For example, when the internal resistance value of the battery is increased, the charging-allowing capacity of the battery may be decreased. Therefore, in the case where the internal resistance value is larger than a reference value even when the leakage state is normal, the electronic device may perform a mode corresponding to a warning state of providing notification that the battery is abnormal.

According to an embodiment, the electronic device may determine whether the battery is normal, according to the leakage level and at least one among the number of times of full charging of the battery and the number of times of full discharging of the battery. For example, the deterioration of the performance of the battery is small when the battery is charged or discharged within a capacity range of about 20-80% and the deterioration of the performance of the battery may be accelerated when the number of times of full charging of the battery or the number of times of full discharging of the battery is large. Therefore, in the case where at least one among the number of times of full charging of the battery or the number of times of full discharging of the battery is larger than a reference number of times even when the leakage state is normal, the electronic device may perform a mode corresponding to a warning state of providing notification that the battery is abnormal.

According to an embodiment, in a mode corresponding to a warning state or a mode corresponding to a danger state, at least one among a function of, when the temperature of the battery is high based on the leakage state, terminating an application which is being executed in the electronic device, a function of, when the temperature of the battery is low based on the leakage state, executing an application which has been stopped, and a function of performing or restoring a prevention function based on the leakage state may be further performed.

According to various embodiments, the electronic device may receive control information for controlling functions of the electronic device in a mode corresponding to a warning state or a mode corresponding to a danger state from an external device (for example, the electronic device 102 in FIG. 1), or another electronic device (for example, the electronic device 104 in FIG. 1) or a server (for example, the server 106 in FIG. 1) which can be connected through a network (for example, the network indicated by 162 in FIG. 1) and may perform a function corresponding to the received control information.

According to various embodiments, a control method based on a battery leakage state in an electronic device may include: identifying a charge current used for charging a battery; determining a leakage state of the battery based on at least a part of the charge current; and performing a function corresponding to the leakage state based on at least a part of the leakage state.

According to an embodiment, the control method may further include: obtaining status information, wherein the determining of the leakage state includes determining a leakage state of the battery based on the status information and the charge current, and the performing of the specified function includes: when the leakage state is a first specified state, performing a first function corresponding to the first specified state, and when the leakage state is a second specified state, performing a second function corresponding to the second specified state.

According to an embodiment, the identifying of the charge current may include identifying, as the charge current, a current measured based on at least a part of a specified time period.

According to an embodiment, a temperature corresponding to the electronic device, the number of times of charging of the battery, and/or the number of times of discharging of the battery may be obtained as at least a part of the status information.

According to an embodiment, the first function may include a function of providing a notification corresponding to the first specified state.

According to an embodiment, the second function may include a function of adjusting at least one operation relating to the charging of the battery.

According to an embodiment, the control method may further include transmitting the status information and attribute information of the charge current to an external device using a communication circuit.

According to an embodiment, the identifying of the charge current may include identifying, as the charge current, a charge current measured during a time period specified based on at least a part of a specified charging profile.

According to an embodiment, the determining of the leakage state may include: determining an excess capacity supplied to the battery; determining a leakage current based on at least a part of the excess capacity; and determining a leakage state based on at least a part of the leakage current.

Figure 12:
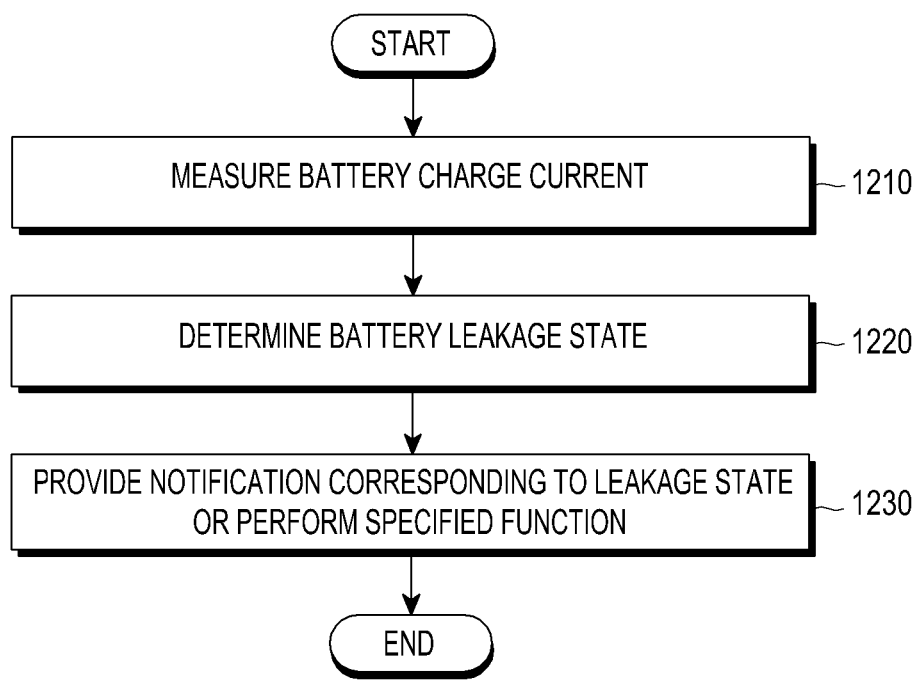
FIG. 12 is a flowchart illustrating example operations based on battery leakage state in an electronic device according to various example embodiments.

FIG. 12 is flowchart illustrating example operations based on a battery leakage state in an electronic device according to various example embodiments.

Referring to FIG. 12, the electronic device according to an embodiment may include the entirety or a part of the electronic device 101 of FIG. 1, the electronic device 201 of FIG. 2, or the electronic device 601 of FIG. 6.

The electronic device (for example, the processor 120 of FIG. 1, the processor 210 of FIG. 2, or the processor 620 of FIG. 6) may measure a charge current of the battery in operation 1210. According to various embodiments, the electronic device may measure a charge current used for charging a battery (for example, the battery 296 of FIG. 2, the battery 689 of FIG. 6, or the battery 730 of FIG. 7) by using a current sensor (for example, the fuel gauge 728 of FIG. 7 or the current sensor 740 of FIG. 7). The electronic device (for example, the processor 120 of FIG. 1, the processor 210 of FIG. 2, or the processor 620 of FIG. 6) may determine a leakage state in operation 1220. According to various embodiments, the electronic device may determine the leakage state of the battery in accordance with the measured charge current.

According to an embodiment, the electronic device may specify a time period based on a battery charging profile, determine a magnitude of a leakage current based on a charge current measured using each specified time period, and determine a leakage state according to the magnitude of a leakage current.

According to an embodiment, the electronic device may calculate (determine) a leakage current value based on an excessive charging amount supplied to the battery and determine a leakage state according to the magnitude of the leakage current based on the leakage current value.

According to an embodiment, the electronic device may determine a leakage state based on the measured charge current and status information. According to various embodiments, the status information may correspond to at least one of a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device.

For example, the electronic device may determine a leakage level according to the magnitude of leakage current based on the measured charge current, and may determine a status level according to status information so as to determine a leakage state depending on the leakage level and the status level. According to various embodiments, a leakage level may be configured to be level A, B, C, D, E, F, or G; as described in FIG. 10, or may be configured to be a plurality of levels depending on the detected leakage current value. According to various embodiments, the status level may be determined to be one level of the plurality of levels according to whether a status corresponds to a status in which the magnitude of leakage current may be rapidly increased. According to various embodiments, a status level may be determined as a level in which the number of times of charging or discharging of the battery is less than 100 times, a level in which the number of times of charging or discharging of the battery is equal to or larger than 100 times and is less than 300 times, and a level in which the number of times of charging or discharging of the battery is larger than 300 times. According to various embodiments, a status level may be determined to be a plurality of levels according to the number of times of fast charging, to be a plurality of levels according to the magnitude of the internal resistance value, or to be a plurality of levels according to the number of times of full charging or the number of times of full discharging, other than the number of times of charging or discharging of the battery. According to another embodiment, a status level may be determined to be a plurality of levels according to at least one among a temperature (for example, the internal temperature of the electronic device, the external temperature of the electronic device, the temperature of the battery mounted in the electronic device, the temperature of a charging circuit in the electronic device, or the like) corresponding to the electronic device, an application which is being executed in the electronic device, the number of leakage states corresponding to abnormality, the number of times of connection to a wired charging device, and the number of times of connection to a wireless charging device. According to various embodiments, the electronic device may determine, as a leakage state, one leakage state of a plurality of leakage states according to a leakage level and a status level. The electronic device (for example, the processor 120 of FIG. 1, the processor 210 of FIG. 2, or the processor 620 of FIG. 6) may provide information corresponding to the leakage state and/or perform a specified function corresponding to the leakage state, in operation 1230. According to various embodiments, when a leakage state is a first specified state, the electronic device may provide first information corresponding to the first specified state, as at least a part of the notification, or when a leakage state is a second specified state, the electronic device may perform a function corresponding to the second specified state, as at least a part of the specified function.

For example, the first specified state may be a warning state and the second specified state may be a danger state. The warning state may be a state of a warning stage of providing notification of the fact the battery state may be dangerous. The danger state may be a state of a danger stage of providing notification of the fact that the battery state is dangerous. A standard for determining whether a leakage state belongs to a first specified state or a second specified state may be variously specified according to influence which the magnitude of a leakage current or a combination of the magnitude of a leakage current and status information exerts on the electronic device. The electronic device may configure a leakage state to be any one of a greater variety of states other than the warning state and the danger state.

According to various embodiments, the first information may be information indicating that the battery is abnormal, information recommending a visit to a service center, or information indicating that some functions may be limited. Also, the first information may be a combination of the pieces of information. The first information can be any information which can warn of leakage of the battery, other than the above pieces of information.

According to various embodiments, a specified function may include a function relating to battery charging or a function of limiting some of various functions of the electronic device. According to an embodiment, a function relating to battery charging may include at least one of a function of lowering a fully-charged voltage of the battery from a first fully-charged voltage (for example, 4.4 V) to a second fully-charged voltage (for example, 4.2 V) which is slightly lower than the first fully-charged voltage, and a function of limiting charging only up to an SOC of 60%. According to an embodiment, a function of limiting some functions may include a function of limiting some of various functions (for example, H/W resource limit, clock speed, etc., other than a call function) of the electronic device.

According to various embodiments, the specified function may further include at least one among a function of, when the temperature of the battery is high based on the leakage state, terminating an application which is being executed in the electronic device, a function of, when the temperature of the battery is low based on the leakage state, executing an application which has been stopped, and a function of performing or restoring a prevention function based on the leakage state.

According to various embodiments, the electronic device may receive control information for controlling the electronic device to perform the specified function from an external device (for example, the electronic device 102 in FIG. 1), or another electronic device (for example, the electronic device 104 in FIG. 1) or a server (for example, the server 106 in FIG. 1) which can be connected through a network (for example, the network indicated by reference numeral 162 in FIG. 1) and may perform a function corresponding to the received control information.

Figure 13:
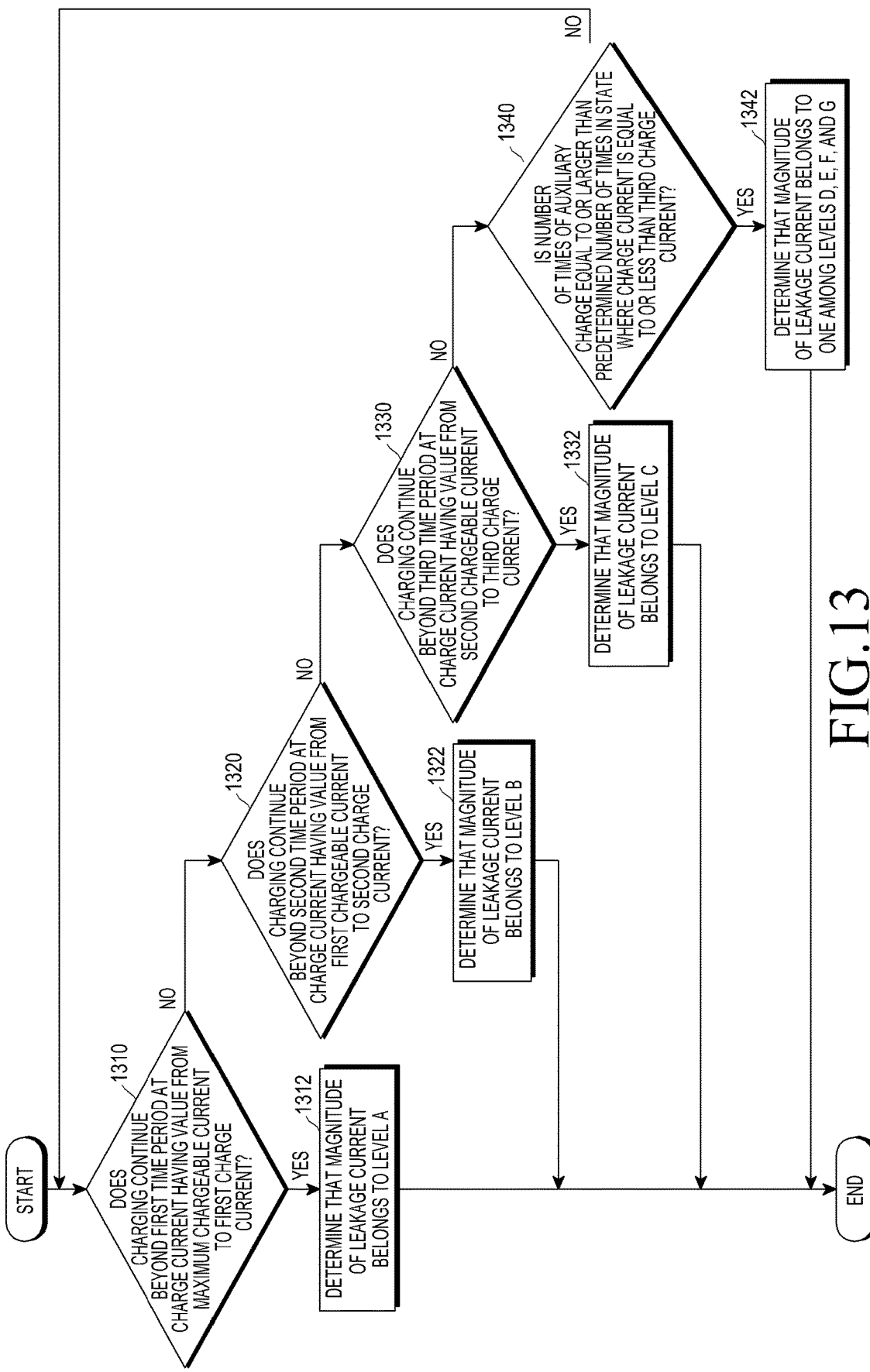
FIG. 13 is a flowchart illustrating an example operation of determining a leakage level based on a charge current provided according to a charging profile in an electronic device according to an example embodiment.

FIG. 13 is a flowchart illustrating an example operation of determining a leakage level based on a charge current provided according to a charging profile in an electronic device according to an example embodiment.

Referring to FIG. 13, the electronic device according to an embodiment may include the entirety or a part of the electronic device 101 of FIG. 1, the electronic device 201 of FIG. 2, or the electronic device 601 of FIG. 6.

The electronic device (for example, the processor 120 of FIG. 1, the processor 210 of FIG. 2, or the processor 620 of FIG. 6) may determine whether charging continues beyond a first time period ($T_A$) at a charge current having a value from a maximum chargeable current to a first charge current, in operation 1310. When a time ($T_{A'}$) during which the battery is charged by a charge current having a value from a maximum chargeable current to a first charge current, exceeds a first time period ($T_A$) based on the measured charge current, the electronic device (for example, the processor 120 of FIG. 1, the processor 210 of FIG. 2, or the processor 620 of FIG. 6) may determine that the magnitude of leakage current belongs to level A, in operation 1312.

The electronic device (for example, the processor 120 of FIG. 1, the processor 210 of FIG. 2, or the processor 620 of FIG. 6) may determine whether charging continues beyond a second time period ($T_B$) at a charge current having a value from a first charge current to a second charge current, in operation 1320.

When a time ($T_{B'}$) during which the battery is charged by a charge current having a value from a first charge current to a second charge current, exceeds a second time period ($T_B$) based on the measured charge current, the electronic device (for example, the processor 120 of FIG. 1, the processor 210 of FIG. 2, or the processor 620 of FIG. 6) may determine that the magnitude of leakage current belongs to level B, in operation 1322.

The electronic device (for example, the processor 120 of FIG. 1, the processor 210 of FIG. 2, or the processor 620 of FIG. 6) may determine whether charging continues beyond a third time period ($T_C$) at a charge current having a value from a second charge current to a third charge current, in operation 1330.

When a time ($T_{C'}$) during which the battery is charged by a charge current having a value from a second charge current to a third charge current, exceeds a third time period ($T_C$) based on the measured charge current, the electronic device (for example, the processor 120 of FIG. 1, the processor 210 of FIG. 2, or the processor 620 of FIG. 6) may determine that the magnitude of leakage current belongs to level C, in operation 1332.

The electronic device (for example, the processor 120 of FIG. 1, the processor 210 of FIG. 2, or the processor 620 of FIG. 6) may determine whether the number of times of auxiliary charge is equal to or larger than a predetermined number of times in a state where the charge current is equal to or less than a third charge current, in operation 1340.

When the number of times of auxiliary charge is equal to or larger than a predetermined number of times in a state where the charge current is equal to or less than a third charge current, the electronic device (for example, the processor 120 of FIG. 1, the processor 210 of FIG. 2, or the processor 620 of FIG. 6) may determine that the magnitude of leakage current belongs to at least one level among levels D, E, F, and G, in operation 1342. According to various embodiments, as the magnitude of leakage current is increased, the number of times of auxiliary charge may be increased. The case of the largest number of times of auxiliary charge may correspond to level D, and the case of the smallest number of times of auxiliary charge may correspond to level G For example, in level D, the number of times of auxiliary charge may be one or more times in one hour, in level E, the number of times of auxiliary charge may be one or more times in three hours, in level F, the number of times of auxiliary charge may be one or more times in six hours, and in level G, the number of times of auxiliary charge may be one or more times in 12 hours. According to various embodiments, in a leakage level, the magnitude of leakage current may be increased in accordance with a sequence of levels A, B, C, D, E, F, and G According to various embodiments, respective levels A, B, C, D, E, F, and G may be included in at least one specified state among a plurality of specified states. A plurality of specified states may include a first specified state or a second specified state. A plurality of specified states may further include another state other than a first specified state or a second specified state. For example, some of levels A, B, C, D, E, F, and G may be included in a first specified state, and another part thereof may be included in a second specified state. According to an embodiment, the first specified state may be a warning state and the second specified state may be a danger state. The warning state may be a warning state of providing notification of the fact the battery state may be dangerous.

The danger state may be a danger state of providing notification of the fact that the battery state is dangerous. For example, some of levels A, B, C, D, E, F, and G may be included in a warning state, and the remainder may be included in a danger state. For example, levels D, E, F, and G may be included in a warning state, and levels A, B, and C may be included in a danger state. According to various embodiments, the leakage level may be specified in a greater of smaller number of levels other than levels A, B, C, D, E, F, and G A standard for determining whether each of the plurality of levels belongs to one of a first specified state or a second specified state may be variously specified according to influence which the magnitude of a leakage current exerts on the electronic device. The electronic device may configure a leakage state to be one of a greater variety of states other than the warning state and the danger state.

Figure 14:
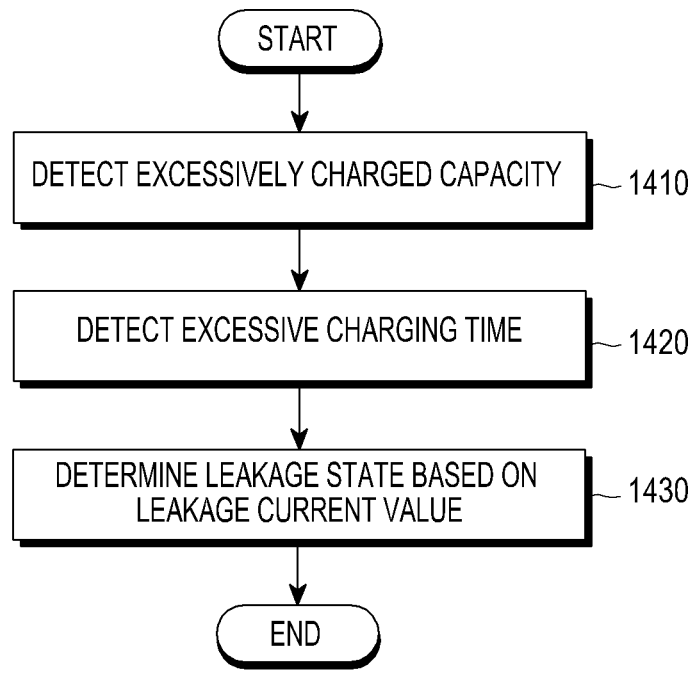
FIG. 14 is a flowchart illustrating an example operation of determining a leakage state based on an excess capacity supplied to a battery in an electronic device according to an example embodiment.

FIG. 14 is a flowchart illustrating an example operation of determining a leakage state based on an excess capacity supplied to a battery in an electronic device according to an example embodiment.

Referring to FIG. 14, the electronic device according to an embodiment may include the entirety or a part of the electronic device 101 of FIG. 1, the electronic device 201 of FIG. 2, or the electronic device 601 of FIG. 6.

The electronic device (for example, the processor 120 of FIG. 1, the processor 210 of FIG. 2, or the processor 620 of FIG. 6) may detect an excessively charged capacity, in operation 1410. According to various embodiments, the electronic device may detect an excessively supplied capacity by comparing a charging-allowing capacity of the battery and a charge capacity actually supplied to the battery. According to an embodiment, when a charge capacity of 4000 mAh is supplied to a battery having a charging-allowing capacity of 3000 mAh, an excess capacity corresponding to 1000 mAh may be detected.

The electronic device (for example, the processor 120 of FIG. 1, the processor 210 of FIG. 2, or the processor 620 of FIG. 6) may detect an excessive charging time, in operation 1420. According to various embodiments, the electronic device may detect an excessive charging time by comparing a time required for charging, the time corresponding to a charging-allowing capacity of the battery and an actual time required for charging.

The electronic device (for example, the processor 120 of FIG. 1, the processor 210 of FIG. 2, or the processor 620 of FIG. 6) may determine a leakage state based on a leakage current value in operation 1430. According to various embodiments, the electronic device may detect a leakage current value using an excessively supplied capacity and an excessive charging time and may determine a leakage state by using the detected leakage current value. According to various embodiments, the electronic device may calculate a leakage current value by dividing an excessively supplied capacity by the excessive charging time. The electronic device may determine a leakage state depending on the magnitude of the calculated leakage current value. According to an embodiment, the electronic device may determine one of a plurality of states as a leakage state according to the magnitude of a leakage current value. For example, the electronic device may determine, as a leakage state, at least one state among a first specified state and a second specified state according to the magnitude of a leakage current value. For example, the first specified state may be a warning state and the second specified state may be a danger state. The warning state may be a state of a warning stage of providing notification of the fact that the battery state may be dangerous. The danger state may be a state of a danger stage of providing notification of the fact that the battery state is dangerous. A standard for determining whether the leakage current value belongs to one of a first specified state and a second specified state may be variously specified according to influence which the magnitude of the value of leaking current exerts on the electronic device. The electronic device may configure a leakage state to be any one of a greater variety of states other than the warning state and the danger state.

Figure 15:
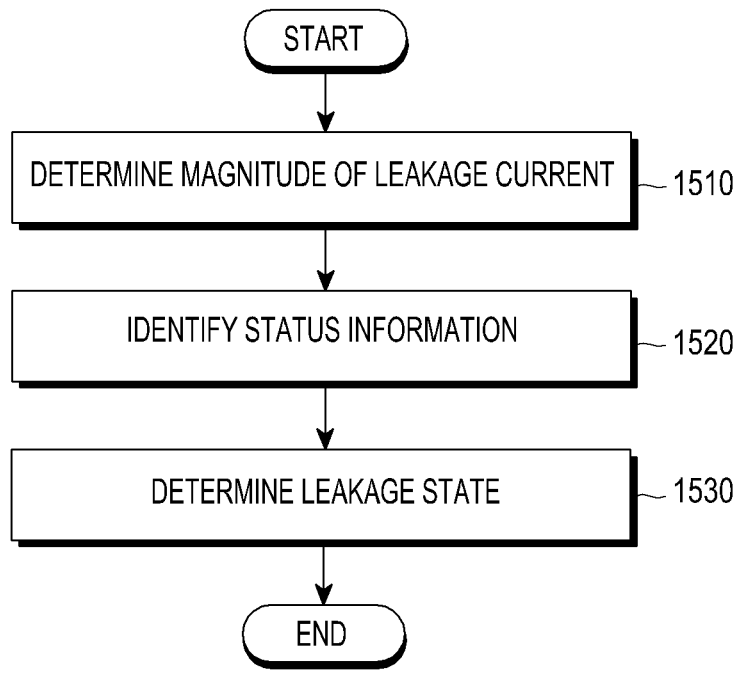
FIG. 15 is a flowchart illustrating an example operation of determining a leakage state based on status information and a charge current used for charging a battery in an electronic device according to an example embodiment.

FIG. 15 is a flowchart illustrating an example operation of determining a leakage state based on status information and a charge current used for charging a battery in an electronic device according to an example embodiment.

Referring to FIG. 15, the electronic device according to an embodiment may include the entirety or a part of the electronic device 101 of FIG. 1, the electronic device 201 of FIG. 2, or the electronic device 601 of FIG. 6.

The electronic device (for example, the processor 120 of FIG. 1, the processor 210 of FIG. 2, or the processor 620 of FIG. 6) may determine the magnitude of leakage current using a charge current used for charging a battery, in operation 1510. According to various embodiments, the electronic device may specify a time period based on a battery charging profile and then may determine whether the magnitude of a leakage current belongs to any level among a plurality of levels based on a charge current measured by using each specified time period, or may calculate a leakage current value based on an excessive charging amount depending on a charge current supplied to the battery and determine the magnitude of the leakage current.

The electronic device (for example, the processor 120 of FIG. 1, the processor 210 of FIG. 2, or the processor 620 of FIG. 6) may identify status information, in operation 1520. According to various embodiments, the electronic device may identify, as a part of status information, at least one among a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device.

The electronic device (for example, the processor 120 of FIG. 1, the processor 210 of FIG. 2, or the processor 620 of FIG. 6) may determine a leakage state using the magnitude of leakage current and status information, in operation 1530.

According to various embodiments, the electronic device may determine a leakage level according to the magnitude of leakage current, and may determine a status level according to status information to determine a leakage state depending on the leakage level and the status level.

According to various embodiments, a leakage level may be configured to be level A, B, C, D, E, F, or G, as described in FIG. 10, or may be configured to be a plurality of levels depending on the detected leakage current value. According to various embodiments, the status level may be determined to be one level among the plurality of levels according to whether a status corresponds to a status in which the magnitude of leakage current may be rapidly increased.

According to various embodiments, a status level may be determined as a level in which the number of times of charging or discharging of the battery is less than 100 times, a level in which the number of times of charging or discharging of the battery is equal to or larger than 100 times and is less than 300 times, and a level in which the number of times of charging or discharging of the battery is larger than 300 times.

For example, when a leakage level is determined to be level G, and a status level is determined to be a level in which the number of times of charging or discharging of the battery is less than 100 times, the electronic device may determine, as a leakage state, a normal state. In addition, when a leakage level is determined to be level G, and a status level is determined to be a level in which the number of times of charging or discharging of the battery is equal to or larger than 100 times and is less than 300 times, the electronic device may determine, as a leakage state, a first specified state, for example, a warning state of providing notification of that the battery state may be dangerous. In addition, when a leakage level is determined to be level G, and a status level is determined to be a level in which the number of times of charging or discharging of the battery is equal to or larger than 500 times, the electronic device may determine, as a leakage state, a second specified state, for example, as a battery state, a danger state.

According to various embodiments, a status level may be determined to be a plurality of levels according to the number of times of fast charging, to be a plurality of levels according to the magnitude of the internal resistance value, or to be a plurality of levels according to the number of times of full charging of the battery or the number of times of full discharging of the battery, other than the number of times of charging or discharging of the battery. According to another embodiment, a status level may be determined to be a plurality of levels according to at least one of a temperature (for example, the internal temperature of the electronic device, the external temperature of the electronic device, the temperature of the battery mounted in the electronic device, the temperature of a charging circuit in the electronic device, or the like) corresponding to the electronic device, an application which is being executed in the electronic device, the number of leakage states corresponding to abnormality, the number of times of connection to a wired charging device, and the number of times of connection to a wireless charging device.

According to various embodiments, the electronic device may determine, as a leakage state, one leakage state among a plurality of leakage states according to a leakage level and a status level. For example, a plurality of leakage states may include a first specified state and a second specified state. For example, the first specified state may be a warning state and the second specified state may be a danger state. The warning state may be a warning state of providing notification of the fact the battery state may be dangerous. The danger state may be a danger state in which the battery state is dangerous. The electronic device may determine, as a leakage state, any one of a greater variety of states other than the warning state and the danger state.

Figure 16:
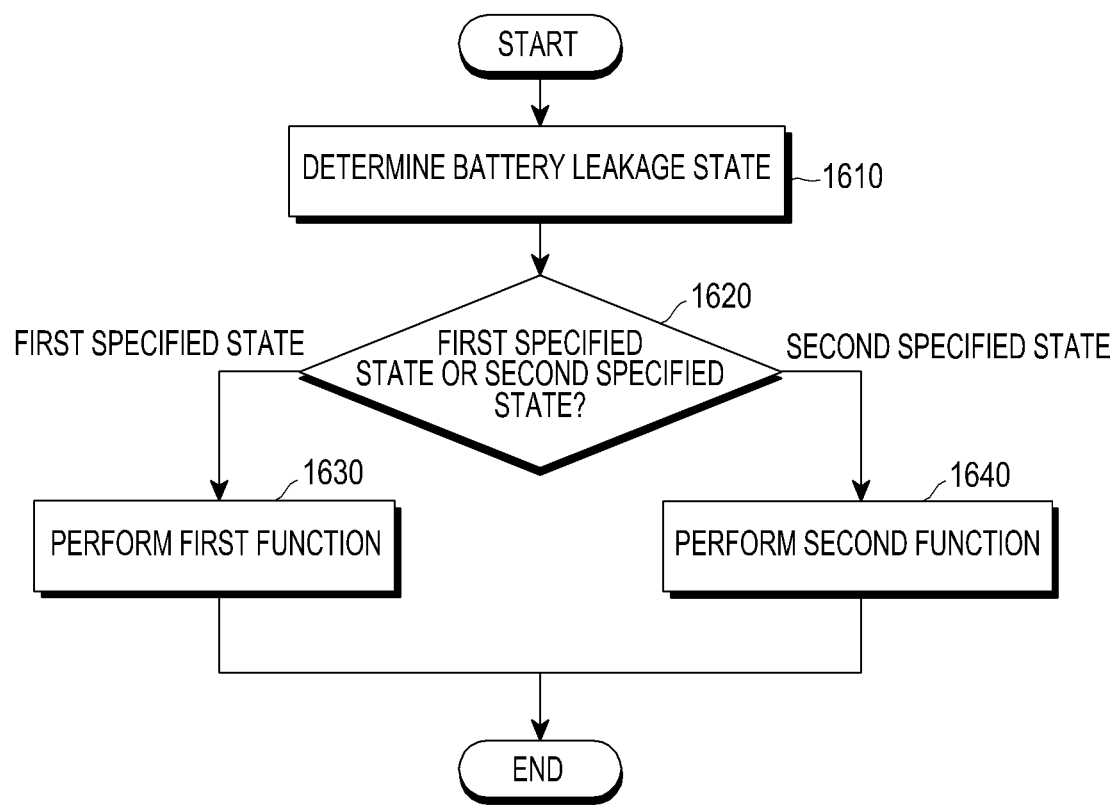
FIG. 16 is flowchart illustrating example operations based on a leakage state in an electronic device according to an example embodiment.

FIG. 16 is flowchart illustrating example operations based on a leakage state in an electronic device according to an example embodiment.

Referring to FIG. 16, the electronic device according to an embodiment may include the entirety or a part of the electronic device 101 of FIG. 1, the electronic device 201 of FIG. 2, or the electronic device 601 of FIG. 6.

The electronic device (for example, the processor 120 of FIG. 1, the processor 210 of FIG. 2, or the processor 620 of FIG. 6) may determine a battery leakage state, in operation 1610. According to various embodiments, the electronic device may determine a battery leakage state based on the measured charge current or may determine a battery leakage state based on the measured charge current and status information.

The electronic device (for example, the processor 120 of FIG. 1, the processor 210 of FIG. 2, or the processor 620 of FIG. 6) may determine whether a battery leakage state is a first specified state or a second specified state, in operation 1620. For example, the first specified state may be a warning state and the second specified state may be a danger state. The warning state may be a warning state of providing notification of the fact the battery state may be dangerous. The danger state may be a danger state in which the battery state is dangerous.

The electronic device (for example, the processor 120 of FIG. 1, the processor 210 of FIG. 2, or the processor 620 of FIG. 6) may perform a first function corresponding to a first specified state, in operation 1630. According to various embodiments, a first function may be a function of providing a notification corresponding to a first specified state. A function of providing a notification corresponding to a first specified state may be a function of indicating first information corresponding to the first specified state on the display. According to various embodiments, the first information may be information indicating that the battery is abnormal, information recommending a visit to a service center, or information indicating that some functions may be limited. Also, the first information may be a combination of the pieces of information. The first information can be any information which can warn of leakage of the battery, other than the pieces of information.

The electronic device (for example, the processor 120 of FIG. 1, the processor 210 of FIG. 2, or the processor 620 of FIG. 6) may perform a second function corresponding to a second specified state, in operation 1640. According to various embodiments, a second function may include a function relating to battery charging or a function of limiting some of various functions of the electronic device. According to an embodiment, a function relating to battery charging may include at least one of a function of lowering a fully-charged voltage of the battery from a first fully-charged voltage (for example, 4.4 V) to a second fully-charged voltage (for example, 4.2 V) which is slightly lower than the first fully-charged voltage, and a function of limiting charging only up to an SOC of 60%. According to an embodiment, a function of limiting some functions may include a function of limiting some of various functions (for example, H/W resource limit, clock speed, etc., other than a call function) of the electronic device.

According to various embodiments, a second function may further include at least one among a function of, when the temperature of the battery is high based on the leakage state, terminating an application which is being executed in the electronic device, a function of, when the temperature of the battery is low based on the leakage state, executing an application which has been stopped, and a function of performing or restoring a prevention function based on the leakage state. According to various embodiments, the electronic device (for example, the processor 120 of FIG. 1, the processor 210 of FIG. 2, or the processor 620 of FIG. 6) may perform a first function while performing a second function corresponding to a second specified state.

According to various embodiments, the electronic device (for example, the processor 120 of FIG. 1, the processor 210 of FIG. 2, or the processor 620 of FIG. 6) may receive control information for controlling the electronic device to perform the specified function, from an external device (for example, the electronic device 102 in FIG. 1), or another electronic device (for example, the electronic device 104 in FIG. 1) or a server (for example, the server 106 in FIG. 1) which can be connected through a network (for example, the network indicated by reference numeral 162 in FIG. 1) and may perform a function corresponding to the received control information.

Figure 17A:
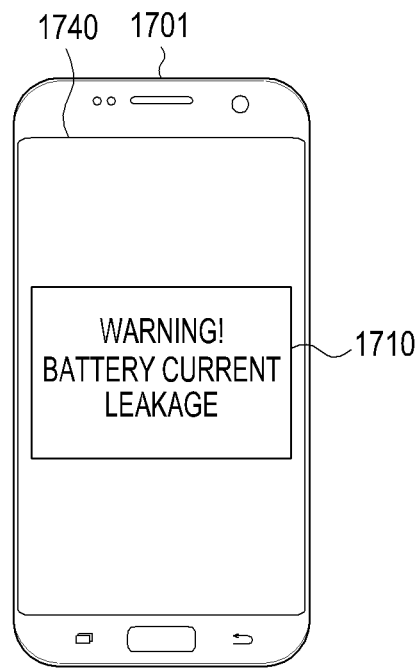
FIGS. 17A, 17B and 17C are diagrams illustrating examples of screens providing information corresponding to a leakage state according to various example embodiments.
Figures 17B, 17C:
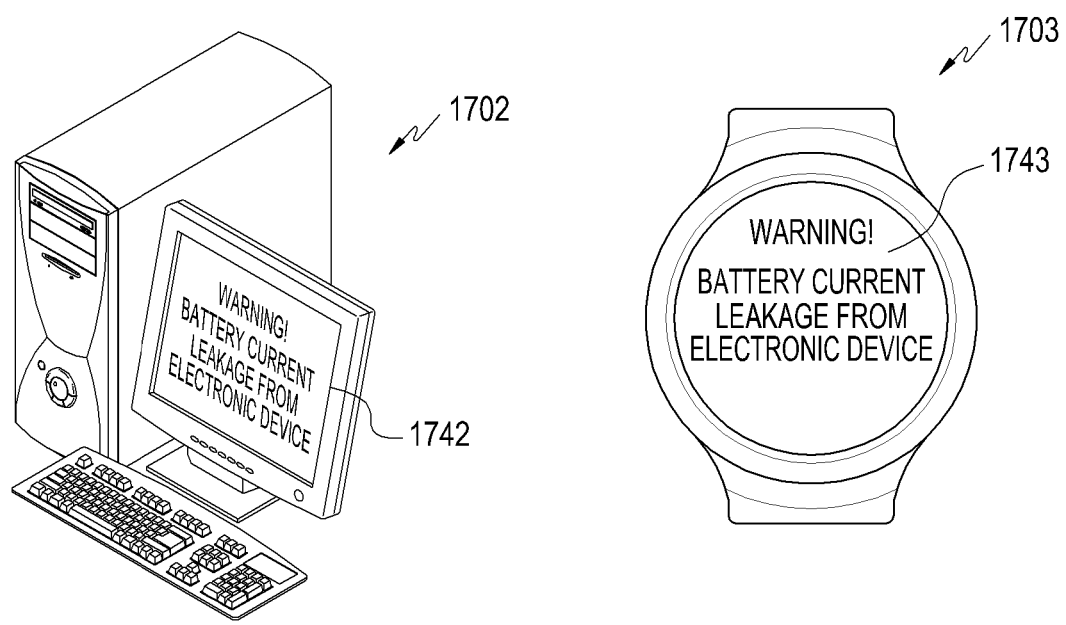

FIGS. 17A, 17B and 17C are diagrams illustrating examples of screens providing information corresponding to a leakage state according to various example embodiments.

Referring to FIG. 17A, an electronic device 1701 (for example, an electronic device including the entirety or a part of the electronic device 101 of FIG. 1, the electronic device 201 of FIG. 2, or the electronic device 601 of FIG. 6) according to an embodiment may display information corresponding to a leakage state on the display 1740.

According to various embodiments, information corresponding to the leakage state may be information indicating that the battery is abnormal, information recommending a visit to a service center, or information indicating that some functions may be limited.

Referring to FIG. 17B, a server 1702 (for example, the server 106 of FIG. 1 or a server 1850 of FIG. 18) according to an embodiment may display information corresponding a leakage state provided from the electronic device 1701 on the display 1742. According to various embodiments, the server 1702 may display both information relating to the electronic device 1701 and information corresponding to a leakage state associated with the electronic device 1701 by using a separate browser.

Referring to FIG. 17C, an external electronic device 1703 (for example, the electronic device indicated by 102 of FIG. 1 or the electronic device 104 of FIG. 1) according to an embodiment may be an electronic device which can establish Peer To Peer (P2P) connection with the electronic device 1701. For example, the external electronic device 1703 may include a wearable device. The wearable device may include at least one of an accessory type (e.g., a watch, a ring, a bracelet, an anklet, a necklace, a pair of glasses, a contact lens, or a Head-Mounted Device (HMD)), a fabric- or clothing-integrated type (e.g., a piece of electronic clothing), a body-mounted type (e.g., a skin pad, or tattoo), and a bio-implantable type (e.g., an implantable circuit), or the like, but is not limited thereto. According to various embodiments, the external electronic device 1703 may display information corresponding to a leakage state provided from the electronic device 1701, on the display 1743. According to various embodiments, the external electronic device 1703 may display both information relating to the electronic device 1701 and information corresponding to a leakage state associated with the electronic device 1701 using a separate application.

Figure 18:
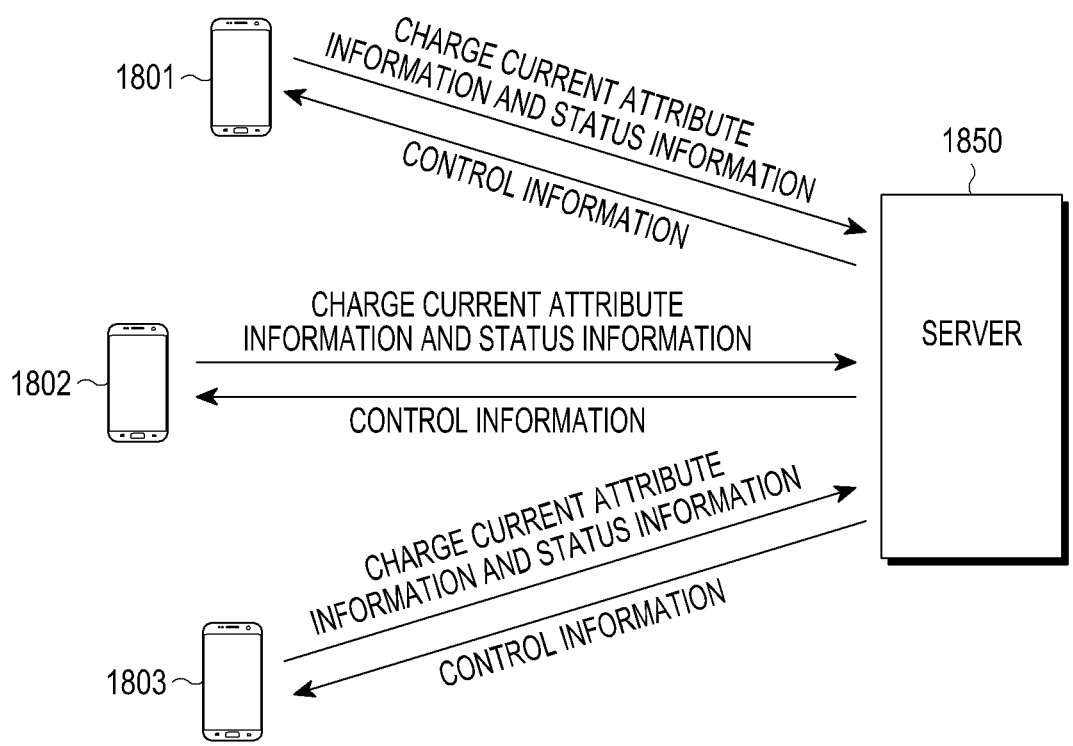
FIG. 18 is a diagram illustrating an example of at least one electronic device and a server according to various example embodiments.

FIG. 18 is a diagram illustrating examples of at least one electronic device and a server according to various example embodiments.

Referring to FIG. 18, each of one or more electronic devices (for example, element indicated by 1801, 1802, or 1803) may transmit attribute information of a charge current and status information to an external server 1850 through communication therewith. According to various embodiments, the attribute information of charge current may include at least one among the measured charge current and a leakage state determined by the measured charge current. The status information may include at least one of a temperature (for example, the internal temperature of the electronic device, the external temperature of the electronic device, the temperature of the battery mounted in the electronic device, the temperature of a charging circuit in the electronic device, or the like) corresponding to the electronic device, the number of times of charging, the number of times of discharging, an application which is being executed in the electronic device, the number of leakage states corresponding to abnormality, the number of times of connection to a wired charging device, and the number of times of connection to a wireless charging device.

According to various embodiments, the server 1850 may receive charge current attribute information and status information received from each of one or more electronic devices (for example, element indicated by 1801, 1802, or 1803) and then may store the received pieces of information. Further, the server 1850 may transmit control information corresponding to the charge current attribute information and status information received from the at least one electronic device (for example, element indicated by 1801, 1802, or 1803) in a feed-back manner to the each of one or more electronic devices (for example, element indicated by 1801, 1802, or 1803).

According to an embodiment, the server 1850 may determine a battery operation state of each of one or more electronic devices (for example, element indicated by 1801, 1802, or 1803) based on the charge current attribute information and status information received from the each of one or more electronic devices (for example, element indicated by 1801, 1802, or 1803). Then, the server 1850 may generate control information corresponding to the each of one or more electronic devices (for example, element indicated by 1801, 1802, or 1803) by using the battery operation state and may transmit the generated control information to the each of one or more electronic devices (for example, element indicated by 1801, 1802, or 1803). According to various embodiments, the control information may be information for controlling the at least one electronic device (for example, element indicated by 1801, 1802, or 1803) to perform a function relating to battery leakage. According to an embodiment, the control information may include information for controlling the at least one electronic device (for example, element indicated by 1801, 1802, or 1803) to notify of information relating to battery leakage, or for controlling to perform a function relating to battery leakage. According to various embodiments, the information relating to battery leakage may include information indicating that the battery is abnormal, information recommending a visit to a service center, information indicating that some functions may be limited, information indicating a possibility of a battery accident, or information indicating instructions about what to do during occurrence of a battery accident. According to various embodiments, a function relating to battery leakage may include a function relating to battery charging or a function of limiting some of various functions of the electronic device. According to an embodiment, a function relating to battery charging may include at least one of a function of lowering a fully-charged voltage of the battery from a first fully-charged voltage (for example, 4.4 V) to a second fully-charged voltage (for example, 4.2 V) which is slightly lower than the first fully-charged voltage, and a function of limiting charging only up to an SOC of 60%. According to an embodiment, a function of limiting some functions may include a function of limiting some of various functions (for example, HAY resource limit, clock speed, etc., other than a call function) of the electronic device.

According to various embodiments, each of one or more electronic devices (for example, element indicated by 1801, 1802, or 1803) may receive control information corresponding to the battery operation state determined by the server 1850, from the server 1850. According to an embodiment, each of one or more electronic devices (for example, element indicated by 1801, 1802, or 1803) may notify of information relating to battery leakage or may perform a function relating to battery leakage in accordance with the received control information.

Each of the elements described in the present disclosure may be configured with one or more components, and the names of the corresponding elements may vary based on the type of electronic device. The electronic device according to various embodiments of the present disclosure may further include at least one of the elements described in the present disclosure. Some elements may be omitted or other additional elements may be further included in the electronic device. Also, some of the elements of the electronic device according to various embodiments may be combined into one entity, which may perform functions identical to those of the relevant elements before the combination.

The term "module" as used herein may, for example, refer to a unit including one of hardware, software, and firmware or any combination of two or more of them. The "module" may be interchangeably used with, for example, the term "unit", "logic", "logical block", "component", or "circuit". The "module" may be a minimum unit of an integrated component or a part thereof. The "module" may be a minimum unit for performing one or more functions or a part thereof. The "module" may be mechanically or electronically implemented. For example, the "module" according to the present disclosure may include, for example, and without limitation, at least one of a dedicated processor, a CPU, an Application-Specific Integrated Circuit (ASIC) chip, a Field-Programmable Gate Arrays (FPGA), and a programmable-logic device for performing operations, or the like, which are already known or are to be developed in the future.

At least some of the devices (for example, modules or functions thereof) or the method (for example, operations) according to various embodiments may be implemented by, for example, an instruction stored in a computer-readable storage medium in a programming module form. The instruction, when executed by a processor (e.g., the processor 120), may cause the one or more processors to execute the function corresponding to the instruction. The computer-readable storage medium may be, for example, the memory 130.

According to various embodiments, in a storage medium that stores a control program based on a battery leakage state, the program may, in an electronic device, measure a charge current, determine a leakage state of the battery based on at least a part of the charge current, and provide a notification corresponding to the leakage state through the display or perform a specified function corresponding to the leakage state based on at least a part of the leakage state.

The computer readable recording medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The module or the programming module according to various embodiments may include one or more of the aforementioned elements or may further include other additional elements, or some of the aforementioned elements may be omitted. Operations executed by a module, a programming module, or other elements according to various embodiments of the present disclosure may be executed sequentially, in parallel, repeatedly, or in a heuristic manner. Furthermore, some operations may be executed in a different order or may be omitted, or other operations may be added.

The electronic device according to various example embodiments of the present disclosure described above is not limited by the aforementioned example embodiments and drawings, and it will be understood by those skilled in the art that various substitutions, modifications, and changes may be made therein without departing from the technical scope of the present disclosure.

What is claimed is:

1. An electronic device comprising:
a display;
a communication circuit;
a battery;
a current sensor; and
a processor,
wherein the processor is configured to:
identify a charge current for charging the battery via the current sensor;
identify a leakage state, among a plurality of leakage states, of the battery based on at least a part of the charge current, wherein information associated with the plurality of leakage states of the battery is stored in a memory of the electronic device; and
provide a notification corresponding to the leakage state through the display and/or perform a specified function corresponding to the leakage state based on at least a part of the leakage state.

2. The electronic device of claim 1, wherein the processor is configured to:
identify of the leakage state further based on status information of the electronic device;
provide first information corresponding to a first specified state as at least a part of the notification when the leakage state is the first specified state; and
perform a function corresponding to a second specified state as at least a part of the specified function when the leakage state is the second specified state.

3. The electronic device of claim 1, wherein the processor is configured to identify, as the charge current, a current measured based on at least a part of a specified period of time.

4. The electronic device of claim 2, wherein the processor is configured to identify, as at least a part of the status information, a temperature of the electronic device, the number of times of charging of the battery, and/or the number of times of discharging of the battery.

5. The electronic device of claim 1, wherein the processor is configured to adjust, as at least a part of the performing of the specified function, at least one function related to charging of the battery.

6. The electronic device of claim 2, wherein the processor is configured to transmit at least one of: the status information and attribute information of the charge current to an external device using the communication circuit.

7. The electronic device of claim 1, further comprising:
a memory configured to store a charging profile,
wherein the processor is configured to measure the charge current during a period of time specified based on at least a part of the charging profile.

8. The electronic device of claim 2, wherein the processor is configured to:
determine an excess capacity supplied to the battery;
determine a leakage current based on at least a part of the excess capacity; and
determine the leakage state based on at least a part of the leakage current.

9. The electronic device of claim 2, wherein the processor is configured to receive control information corresponding to an operation state of the battery determined in an external device, and to perform a function corresponding to the received control information.

10. A method of controlling an electronic device based on a battery leakage state, the control method comprising:
identifying a charge current for charging a battery;
identifying a leakage state, among a plurality of leakage states, of the battery based on at least a part of the charge current, wherein information associated with the plurality of leakage states of the battery is stored in a memory of the electronic device; and
performing a specified function corresponding to the leakage state based on at least a part of the leakage state.

11. The method of claim 10, further comprising:
obtaining status information,
wherein the determining of the leakage state includes determining a leakage state of the battery based on the status information and the charge current, and
the performing of the specified function includes:
performing a first function corresponding to a first specified state when the leakage state is the first specified state; and
performing a second function corresponding to a second specified state when the leakage state is the second specified state.

12. The method of claim 10, wherein the identifying of the charge current includes identifying, as the charge current, a current measured based on at least a part of a specified period of time.

13. The method of claim 10, wherein a temperature corresponding to the electronic device, the number of times of charging of the battery, and/or the number of times of discharging of the battery is obtained as at least a part of the status information.

14. The control method of claim 11, wherein the first function includes a function of providing a notification corresponding to the first specified state, and wherein the second function includes a function of adjusting at least one operation related to charging of the battery.

15. The control method of claim 11, wherein the identifying of the charge current includes identifying, as the charge current, a current measured during a period of time specified based on at least a part of a specified charging profile.

16. The control method of claim 11, wherein the determining of the leakage state includes:
determining an excessive capacity supplied to the battery;
determining a leakage current based on at least a part of the excess capacity; and
determining a leakage state based on at least a part of the leakage current.

17. An electronic device comprising:
a display;
a communication circuit;

a battery;

a current sensor; and a processor, wherein the processor is configured to:

identify a charge current for charging the battery via the current sensor;

identify a current leakage state, among a plurality of leakage states, of the battery based on at least a part of the charge current, wherein information associated with the plurality of leakage states of the battery is stored in a memory of the electronic device;

provide a notification corresponding to a first state through the display when the current leakage state is the first state; and limit at least one function related to the charging of the battery when the current leakage state is a second state.

18. The electronic device of claim 17, wherein the processor is configured to identify, as the charge current, a current measured based on at least a part of a specified period of time.

19. The electronic device of claim 17, wherein the processor is configured to identify, as at least a part of the status information, a temperature corresponding to the electronic device, the number of times of charging of the battery, and/or the number of times of discharging of the battery.

20. The electronic device of claim 17, wherein the processor is configured to transmit the status information and/or attribute information of the charge current to an external device using the communication circuit.

* * * * *